United States Patent
Veeraraghavan et al.

(10) Patent No.: US 8,900,420 B2
(45) Date of Patent: Dec. 2, 2014

(54) CATALYST PRODUCTION PROCESS

(75) Inventors: Badri Veeraraghavan, Woodbury, MN (US); Thomas E. Wood, Stillwater, MN (US); Craig S. Chamberlain, Woodbury, MN (US); Sheryl A. Vanasse, Spring Valley, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 40 days.

(21) Appl. No.: 11/841,362

(22) Filed: Aug. 20, 2007

(65) Prior Publication Data

US 2009/0054230 A1 Feb. 26, 2009

(51) Int. Cl.
| | |
|---|---|
| *C23C 14/35* | (2006.01) |
| *B01J 21/18* | (2006.01) |
| *A62D 9/00* | (2006.01) |
| *B01J 21/06* | (2006.01) |
| *B01J 23/52* | (2006.01) |
| *B01J 35/00* | (2006.01) |
| *B01J 35/02* | (2006.01) |
| *B01J 35/10* | (2006.01) |
| *B01J 37/12* | (2006.01) |
| *B01J 37/14* | (2006.01) |
| *B01J 37/34* | (2006.01) |
| *C23C 14/00* | (2006.01) |
| *C23C 14/08* | (2006.01) |
| *C23C 14/34* | (2006.01) |
| *A62B 23/02* | (2006.01) |
| *A62B 23/04* | (2006.01) |

(52) U.S. Cl.
CPC ............. *B01J 21/18* (2013.01); *C23C 14/0036* (2013.01); *C23C 14/08* (2013.01); *C23C 14/3457* (2013.01); *C23C 14/0021* (2013.01); *A62B 23/02* (2013.01); *A62B 23/04* (2013.01); *A62D 9/00* (2013.01); *B01J 21/063* (2013.01); *B01J 23/52* (2013.01); *B01J 35/006* (2013.01); *B01J 35/023* (2013.01); *B01J 35/10* (2013.01); *B01J 37/12* (2013.01); *B01J 37/14* (2013.01); *B01J 37/347* (2013.01)
USPC ................................................. 204/192.15

(58) Field of Classification Search
CPC ..... C23C 14/08; C23C 14/3457; C23C 14/0036; C23C 14/0021
USPC ................................................. 204/192.15
See application file for complete search history.

(56) References Cited

U.S. PATENT DOCUMENTS

| | | | |
|---|---|---|---|
| 4,046,712 A | 9/1977 | Cairns et al. | |
| 4,469,640 A | 9/1984 | Carcia et al. | |

(Continued)

FOREIGN PATENT DOCUMENTS

| | | |
|---|---|---|
| EP | 0 827 779 A | 3/1998 |
| GB | 1 486 108 A | 9/1977 |

(Continued)

OTHER PUBLICATIONS

Pfeffer et al. in "Synthesis of Engineered Particulates with Tailored Properties Using Dry Particle Coating", Powder Technology 117, 40-67 (2001).

(Continued)

*Primary Examiner* — Jason M Berman
(74) *Attorney, Agent, or Firm* — Kenneth B. Wood

(57) ABSTRACT

A process for producing gold-based, heterogeneous catalyst systems comprises depositing fine-nanoscale gold onto a nanoparticulate support medium by physical vapor deposition in an oxidizing atmosphere.

34 Claims, 3 Drawing Sheets

(56) References Cited

U.S. PATENT DOCUMENTS

| | | | |
|---|---|---|---|
| 4,536,482 A * | 8/1985 | Carcia | 502/5 |
| 4,618,525 A | 10/1986 | Chamberlain et al. | |
| 4,799,745 A | 1/1989 | Meyer | |
| 4,847,234 A | 7/1989 | Hums | |
| 5,058,578 A * | 10/1991 | Weiss | 128/205.27 |
| 5,492,627 A * | 2/1996 | Hagen et al. | 210/651 |
| 5,670,247 A | 9/1997 | Takaoka | |
| 5,789,337 A | 8/1998 | Haruta et al. | |
| 5,879,827 A | 3/1999 | Debe | |
| 5,932,750 A * | 8/1999 | Hayashi et al. | 549/523 |
| 6,139,831 A * | 10/2000 | Shivashankar et al. | 530/351 |
| 6,229,018 B1 | 5/2001 | Heinz | |
| 6,752,889 B2 | 6/2004 | Insley et al. | |
| 6,911,413 B2 | 6/2005 | Wu et al. | |
| 7,431,905 B2 | 10/2008 | Hancu | |
| 2003/0042226 A1 | 3/2003 | Coll et al. | |
| 2003/0187294 A1 | 10/2003 | Hagemeyer et al. | |
| 2005/0095189 A1 | 5/2005 | Brey et al. | |
| 2006/0099125 A1 | 5/2006 | Wu et al. | |
| 2006/0293175 A1 | 12/2006 | Dai | |
| 2007/0207079 A1 | 9/2007 | Brady et al. | |

FOREIGN PATENT DOCUMENTS

| | | |
|---|---|---|
| JP | H04-504555 | 8/1992 |
| JP | 11229115 A | 8/1999 |
| JP | 2001-519594 | 10/2001 |
| JP | 2005-076085 | 3/2005 |
| JP | 2005-334685 | 12/2005 |
| JP | 2006-130178 | 5/2006 |
| WO | WO 2005-030382 A2 | 4/2005 |
| WO | WO 2006-074126 A2 | 7/2006 |

OTHER PUBLICATIONS

Wise, "High Dispersion Platinum Catalyst by RF Sputtering," Journal of Catalysis 83, 477-479 (1983).

Bond and Thompson, G.C. Bond and David T. Thompson, *Gold Bulletin*, 2000, 33(2) 41.

Wolf and Schüth, *Applied Catalysis A: General*, 2002, 226 (1-2) 1-13.

Xueyuan Wu, Annabella Selloni, Michele Lazzeri, and Saroj K. Nayak, *Phys. Rev. B* 68, 241402(R), 2003.

Hersey in "Ordered Mixing: A New Concept in Powder Mixing Practice", Powder Technology 11, 41-44 (1975).

T. Alexander Nijhuis, Tom Visser, and Bert M. Weckhuysen, *J. Phys. Chem. B* 2005, 109, 19309-19319.

G. Veith, "Nanoparticles of Gold on Gamma Al2O3 Produced by DC Magnetron Sputtering", *Journal of Catalysis, Science Direct*, 231(1), 2005, pp. 151-158.

K.Y. Ho and K.L. Yeung, "Effects of Ozone Pretreatment on the Performance of Au/TiO$_2$ Catalyst for CO Oxidation Reaction," Journal of Catalysis 242, 131-141 (2006).

M. Daté, et al., "Vital Role of Moisture in the Catalytic Activity of Supported Gold Nanoparticles," Angew. Chem. Int. Ed. 43, 2129-2132 (2004).

A. Zwijnenburg et al., "XPS and Mössbauer Characterization of Au/TiO$_2$ Propene Epoxidation Catalysts", J. Phys. Chem. B 106, 9853-9862 (2002).

M. Haruta, "Size and Support-dependency in the Catalysis of Gold", Catalysis Today, 36, 153-166 (1997).

G.C. Bond et al., "Catalysis by Gold", Catalysis Reviews Science and Engineering 41, No. 3/4, 319-388 (1999).

M. Valden et al., "Onset of Catalytic Activity of Gold Clusters on Titania with the Appearance of Nonmetallic Properties", Science 281, No. 5383, 1647-1650 (1998).

P. Kalck et al., "Chemical Vapor Deposition Methods for the Controlled Preparation of Supported Catalytic Materials", Chemical Reviews 102, No. 9, 3085-3128 (2002).

3M Innovative Properties Company, Wood et al., International Patent Application No. US2007/004134, "Selective Oxidation of Carbon Monoxide Relative to Hydrogen Using Catalytically Active Gold", filed Feb. 13, 2007.

Brey et al., U.S. Appl. No. 11/674,348, "Catalytically Active Gold Supported on Thermally Treated Nanoporous Supports", filed Feb. 13, 2007.

PCT International Search Report PCT/ISA/210.

Chen, Yeong-Jey et al., *Deposition of Highly Dispersed Gold on Alumina Support*, Journal of Catalysis, vol. 200, No. 1, pp. 59-68 (May 15, 2001).

Kobayashi et al., Thin Films of Supported Gold Catalysts for CO Detection, Sensors and Actuators, B1 (1990) pp. 222-225.

Prati et al., Gold on Carbon as a New Catalyst for Selective Liquid Phase Oxidation of Diols, Journal of Catalysis 176, (1998) pp. 552-560.

Jensen, et al., XPX and FTIR investigation of the surface properties of different prepared titania nano-powders, Science Direct, Applied Surface Science, 246 (2005) pp. 239-249.

* cited by examiner

CATALYST PRODUCTION PROCESS

FIELD

This invention relates to processes for producing gold-based catalyst systems, to catalyst systems produced thereby, to articles comprising the catalyst systems, and to use of the catalyst systems in catalysis processes.

BACKGROUND

Nanoscale gold particles exhibit physical and chemical properties different from those of ordinary coarse gold grains. In particular, nanoscale gold is catalytically active and can be used as a catalyst for oxidizing carbon monoxide to form carbon dioxide. Catalytically active gold also has been proposed for use in catalyzing other oxidation reactions, such as the oxidation of carbonaceous soot in diesel exhaust streams, the oxidation of unsaturated and saturated hydrocarbons, and the like.

Generally, nanoparticles of gold are very mobile, possess large surface energies, and tend to coalesce easily. Coalescence has been difficult to prevent, making gold difficult to maintain in nanoparticle form. Such coalescence is undesirable, as the catalytic activity of gold tends to fall off as its particle size increases. This problem is relatively unique to gold and is much less of an issue with other noble metals such as platinum and palladium. Thus, methods to deposit and immobilize gold nanoparticles on a carrier in a uniformly dispersed state have been sought.

The primary methods developed to date to deposit catalytically active gold on various supports include (i) coprecipitation, in which a support and gold precursors are brought out of solution as hydroxides, for example, by adding a base such as sodium carbonate; (ii) deposition-precipitation, in which a gold precursor is precipitated onto a suspension of pre-formed support by an increase in pH; and (iii) a method in which a gold-phosphine complex (for example, $[Au(PPh_3)]NO_3$) is made to react with a freshly precipitated support precursor. Other procedures such as the use of colloids, grafting, and vapor deposition have met with varying degrees of success.

The above-cited methods, however, have suffered from serious reproducibility problems. Such reproducibility problems have resulted from difficulty in controlling gold particle size, poisoning of the gold catalyst by ions such as chloride, loss of active gold in pores of the support, necessity in some cases of thermal treatment to activate the gold catalyst, inactivation of certain catalytic sites by thermal treatment, lack of control of gold oxidation state, and the inhomogeneous nature of the hydrolysis of gold solutions by the addition of aqueous base.

Gold catalysts produced by the above-mentioned deposition-precipitation method have typically been activated by thermal treatment in air. In at least one case, however, such thermal treatment has been carried out in an atmosphere comprising ozone. The latter process yielded a more stable but less active catalyst than a corresponding catalyst that was activated in air.

Physical vapor deposition (PVD) techniques have been used to deposit gold on various non-nanoporous support media, such as ceramic titanates that were made under conditions so as to lack nanoporosity. More recently, effective heterogeneous catalyst systems have been produced by providing catalytically active gold on nanoporous supports including a composite support derived from relatively small titania particles (referred to as guest material) that at least partially coat the surfaces of larger alumina or activated carbon particles (referred to as host material). These composite systems have provided effective catalytic performance with respect to carbon monoxide oxidation.

In short, gold offers tremendous potential as a catalyst, but the difficulties involved in producing and maintaining gold in nanoparticle form have continued to hinder the development of commercially feasible, gold-based catalyst systems.

SUMMARY

Thus, we recognize that improved gold-based catalyst systems and processes for their production are needed. In particular, we recognize a need for gold-based systems and processes that can deliver enhanced catalytic activity or, in view of the relatively high cost of gold, equivalent or better catalytic activity at a lower cost than current systems and processes.

Briefly, in one aspect, this invention provides a process for producing gold-based, heterogeneous catalyst systems. The process comprises depositing fine-nanoscale gold onto a nanoparticulate support medium by physical vapor deposition in an oxidizing atmosphere. Preferably, the oxidizing atmosphere comprises at least one oxygen-containing gas (more preferably, an oxygen-containing gas selected from oxygen, water, hydrogen peroxide, ozone, and combinations thereof).

It has been discovered that the use of physical vapor deposition (PVD) methodologies to deposit fine-nanoscale gold on nanoparticulate support media (for example, porous agglomerates of nanoparticles, relatively high surface area sol-gel-derived materials, relatively high surface area gamma alumina, and the like) can make the use of catalytically active gold dramatically easier and can provide significant improvements in developing, making, and using gold-based catalyst systems. In particular, it has been discovered that carrying out physical vapor deposition of fine-nanoscale gold (for example, by sputtering) on nanoparticulate substrates in an oxidizing atmosphere can provide gold-based catalyst systems that exhibit surprisingly enhanced catalytic activity.

The process of the invention can provide, for a given quantity of deposited gold, catalyst systems that achieve greater catalysis of oxidation processes (for example, oxidation of carbon monoxide) than corresponding systems prepared in a non-oxidizing atmosphere (for example, consisting of argon gas only). This means that effective oxidation catalyst activity can be obtained for lower loadings of gold. Only a small amount of gold is generally necessary for relatively high activity. Thus, at least some embodiments of the process of the invention can meet the above-mentioned need for processes that provide gold-based catalyst systems exhibiting equivalent or better catalytic activity at a lower cost than current systems and processes.

The process of the invention can provide catalyst systems that are robust (for example, catalytically active for relatively long periods), consistent, and relatively uniform (for example, with respect to gold concentration per particle, particle size, and particle size distribution) even when non-uniform or non-homogeneous support surfaces are utilized. Nanoparticulate support media used in the process not only have high surface areas but also comprise nanoscale features that apparently help to immobilize the gold, thereby preventing gold particle coalescence that might otherwise result in a loss of performance.

Preferred support media include composite support media comprising guest material (for example, titania nanoparticles) borne on at least a portion of the surface of host material (for example, coarser, activated carbon particles). The size, size distribution, and nature of the fine-nanoscale gold (for example, discrete particles or atom clusters) can be controlled by controlling the nature of the surface of the support and the sputtering conditions during gold deposition.

The process of the invention can provide gold that is active upon deposit by PVD. There is generally no need for a heat treatment to activate the catalyst as is the case with some other methodologies, making the process well-suited for use with oxidatively-sensitive supports (for example, carbon, which otherwise often requires the use of a reducing atmosphere). The resulting catalyst systems can be effective in humid environments and can work over a wide temperature range, including room temperature (for example, about 22° C. to about 27° C.) and much cooler (for example, less than 5° C.).

Unlike solution state processes, the physical vapor deposition process is very clean and introduces essentially no impurities into the catalyst system. There is generally no need for washing steps to remove chloride or other undesirable ions, molecules, or reaction by-products. Other metals can be deposited simultaneously or sequentially, if desired, to enable catalysis of more than one reaction (for example, simultaneous oxidation of carbon monoxide and other airborne contaminants such as $SO_2$).

The gold-based catalyst systems produced by the process of the invention can provide cost effective carbon monoxide abatement (for example, through use in personal respirators, as well as in vehicle and building protection). In addition, the systems can be used for the purification of exhaust gases from internal combustion engines, for removal of carbon monoxide from fuel cell feedstocks, and in catalyzing other oxidation reactions such as the oxidation of carbonaceous soot in diesel exhaust streams and the selective oxidation of organic compounds (for example, unsaturated and saturated hydrocarbons).

In another aspect, this invention also provides a catalyst system comprising fine-nanoscale gold on nanoparticulate titania, the fine-nanoscale gold being present in an amount that is greater than about 1 weight percent (and, preferably, less than about 10 weight percent), based upon the total weight of fine-nanoscale gold and nanoparticulate titania, and the fine-nanoscale gold on nanoparticulate titania exhibiting a color that is described by a set of CIE color coordinates L*, a*, and b*, wherein the L* color coordinate is greater than about 64, the a* color coordinate is less than about zero, and the b* color coordinate is less than about zero, as determined by total reflectance measurements using a d/8° geometry.

In yet another aspect, this invention further provides respiratory protection articles comprising the above-described catalyst system of the invention.

In still another aspect, this invention provides a process for catalysis comprising (a) providing the above-described catalyst system of the invention or a catalyst system prepared by the above-described process of the invention; and (b) using the catalyst system to oxidize a material contacting the catalyst system.

BRIEF DESCRIPTION OF DRAWING

These and other features, aspects, and advantages of the present invention will become better understood with regard to the following description, appended claims, and accompanying drawing, wherein:

Figure 1:
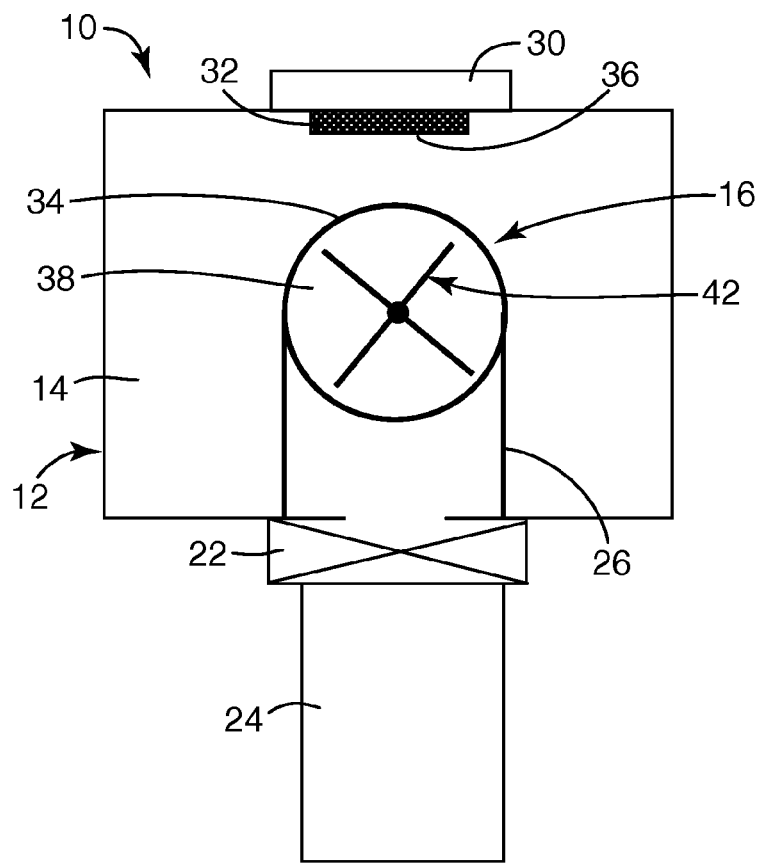
FIG. 1 shows, in side sectional view, an apparatus for carrying out an embodiment of the process of the invention.

These figures, which are idealized, are not drawn to scale and are intended to be merely illustrative and nonlimiting.

DETAILED DESCRIPTION

Gold

The process of the invention can provide fine-nanoscale gold on nanoparticulate support(s) to form heterogeneous catalyst systems. Gold is widely known as a noble, relatively inert metal with a yellowish color. However, the characteristics of gold can change dramatically in nanoscale (less than 100 nanometers) regimes (especially at the lower end of nanoscale regimes; for example, at size ranges characterized by at least one dimension being less than about 10 nanometers (nm) in size), where gold can become catalytically active. As used herein, the term "fine-nanoscale gold" refers to gold bodies (for example, particles or atom clusters) having all dimensions less than or equal to 5 nanometers (nm) in size.

Catalytically active gold can be identified by one or more characteristics including certain size, color, and/or electrical characteristics. Generally, if a gold sample has one or more of these requisite characteristics, and preferably two or more of these characteristics, it will be deemed to be catalytically active in the practice of the process of the invention.

Nanoscale size is a characteristic associated with catalytically active gold, in that the catalytic activity of gold is largely a function of whether a gold sample has at least one dimension (for example, particle diameter, fiber diameter, film thickness, or the like) in the nanoscale regime. Bodies (also sometimes referred to as clusters in the literature) having smaller dimensions tend to be more catalytically active. As size increases, catalytic characteristics generally fall off rapidly.

Accordingly, preferred embodiments of catalytically active gold can have a fine-nanoscale size over the above-specified range, with smaller sizes more preferred when higher activity is desired. Preferably, catalytically active gold has all dimensions (for example, particle diameter or atom cluster diameter) in the range of up to (less than or equal to) about 5 nm in average size (more preferably, up to about 4 nm; even more preferably, up to about 3 nm). Most preferably, individual gold nanoparticles have a size of no more than about 2 nm in any dimension. Preferred embodiments can comprise nanoparticles that are at least about 0.1 nm in at least one dimension (more preferably, at least about 0.5 nm) and no greater than the above-described upper limits in any dimension.

In most preferred embodiments, at least a portion of the gold is ultra-nanoscale (that is, having at least two dimensions less than 0.5 nm in size and all dimensions less than 1.5 nm in size). The size of individual gold nanoparticles can be determined by transmission electron microscopy (TEM) analysis, as is well known in the art.

The amount of gold provided on a support can vary over a wide range. Since gold is expensive, it is desirable not to use more gold than is reasonably needed to achieve a desired degree of catalytic activity. Additionally, because nanoscale gold is highly mobile when deposited using PVD, catalytic activity can be compromised if too much gold is used, due to coalescence of at least some of the gold into large bodies.

For these reasons, the weight loading of gold on a nanoparticulate support preferably is in the range of about 0.005 (more preferably, 0.05) to about 10 weight percent, more preferably about 0.005 (even more preferably, 0.05) to about 5 weight percent, and even more preferably from about 0.005 (most preferably, 0.05) to about 2.5 weight percent, based upon the total weight of the nanoparticulate support and the gold. When the nanoparticulate support is a composite of two or more constituents (for example, a composite formed by providing a plurality of one or more kinds of guest particles on one or more kinds of host particles, as described below), the total weight of the nanoparticulate support refers to the total weight of the resultant composite support medium. Thus, when using such composite supports, preferred loadings of gold can be at the lower end of the above ranges (for example, from about 0.005 to about 1 weight percent; more preferably, from about 0.005 to about 0.5 weight percent). The process of the invention can be used to achieve enhanced catalytic activity for a given quantity of deposited gold, thereby providing equivalent or better performance at lower cost.

Gold can be deposited by PVD techniques (for example, by sputtering) to form catalytically active, fine-nanoscale particles or atom clusters on a nanoparticulate support surface. It is believed that the gold is deposited mainly in elemental form, although other oxidation states may be present. Although gold is mobile and will tend to accumulate in low energy sites of the surface, the nanoparticulate characteristics of the support and the preferred use of activating agents in the process of the invention apparently help to immobilize the gold and to keep the deposited gold particles and clusters isolated or discrete and preferably discontinuous. This can help to preserve catalytic activity that might otherwise be compromised if the gold were to coalesce into larger-sized bodies.

In addition to gold, one or more other metals can also be provided on the same nanoparticulate supports and/or on other supports intermixed with gold-containing supports. Examples of such other metals include silver, palladium, platinum, rhodium, ruthenium, osmium, copper, iridium, and the like, and combinations thereof. If used, these other metals can be co-deposited on a support from a target source that is the same or different from the gold source target that is used. Alternatively, such metals can be provided on a support either before or after the gold is deposited. Metals requiring a thermal treatment for activation advantageously can be applied to a support and heat treated before the gold is deposited.

Support Medium

Support media suitable for use in the process of the invention include those that are nanoparticulate. As used herein, the term "nanoparticulate support medium" means a support medium that comprises nanoparticles having an average diameter less than 50 nanometers (nm), where "diameter" refers not only to the diameter of substantially spherical particles but also to the longest dimension of non-spherical particles. Preferably, the nanoparticles have at least two dimensions less than or equal to about 30 nm in size (more preferably, less than or equal to about 15 nm; most preferably, less than or equal to about 10 nm). The nanoparticulate support media can optionally further comprise larger particles (for example, nanoparticles having an average diameter greater than 50 nm and less than 100 nm, or even larger particles) in minor amounts (that is, less than 50 percent of the total weight of the nanoparticulate support medium; more preferably, less than about 20 percent; most preferably, less than about 10 percent) or, when composite support media (described below) are utilized, in greater than minor amounts.

The nanoparticulate characteristic of the support appears to aid in immobilizing gold deposited on the support surface, as smaller particle sizes of gold and higher catalytic activity can be observed using such supports. Also, gold can be deposited onto nanoparticulate supports using PVD in a catalytically active state, generally without the need for additional thermal or other treatment for activation.

The nanoparticles of the nanoparticulate support media are preferably associated in some manner to form agglomerates. For example, the nanoparticles can be associated physically (for example, through London forces or hydrogen bonding) or chemically (for example, through covalent or ionic bonding). The resulting agglomerates preferably have all dimensions in the range of about 0.1 micrometer to about 15 micrometers in average size. The agglomerates can be further assembled (for example, through spray drying, sol-gel processes, or coating, with or without the use of adhesion agents) to form agglomerate networks.

The agglomerates generally can be porous (even when formed from non-porous nanoparticles) due to the generally imperfect packing of the nanoparticles from which they are formed. Preferably, either the nanoparticles or the resulting agglomerates (or both) are porous. The agglomerates can be relatively robust (for example, when formed by sol-gel processes using nanoparticle sol precursors) or relatively friable (for example, when formed within a dry powder bed or by the drying of a dispersion of agglomerates in liquid). Sol-gel formation processes can include drying and/or thermal treatments, which can bond the nanoparticles together without removing the porosity created by imperfect packing of the nanoparticles in the intermediate gel.

Preferably, the nanoparticulate support media used in the process of the invention have a porosity (that is, the volume ratio of pore space to the total volume of the support medium) greater than about 0.4 (preferably, greater than about 0.5). Porosities can be observed and measured via transmission electron microscopy (TEM).

More preferably, the nanoparticulate support media are nanoporous (that is, have a porosity greater than about 0.4 and pore diameters ranging from about 1 nm to about 100 nm in size). Most preferably, the nanoparticulate support media can have a total nanoporous capacity for pores in the size range of 1 to 10 nm that is greater than about 20 percent (that is, greater than about 0.20 using the formula below) of its total volume of pores in the size range of 1 to 100 nm, as calculated using the following formula (with data obtained, for example, by TEM):

$$NPC = \frac{CPv_1 - CPv_{10}}{CPv_1 - CPv_{100}}$$

wherein NPC refers to the total nanoporous capacity of the support medium; $CPv_n$ refers to the cumulative pore volume at pore radius n in cubic centimeters per gram ($cm^3/g$); and n is the pore radius in nanometers.

Preferred nanoparticulate support media include those that are nanoporous in an exterior surface region of the support medium at a depth equal to or greater than the penetration depth of gold atoms deposited by PVD. Normally low surface area, non-nanoporous materials can be made to possess exterior surfaces characterized by nanoporosity by various methods (for example, by adsorption of nanoporous materials such as nanoparticle size colloids on the surface of a larger, host material to form a composite; by hydrolysis of metal alkoxides or metal salts on the surface of a material; and by oxidation of a thin film of metal such as aluminum, titanium, tin, antimony, or the like, on the surface of a material). In the latter case, the thin metal films can be deposited by PVD methods, and the oxidation can be carried out by dry or moist air to produce a nanoporous film on the material.

Useful nanoparticulate support media can comprise various forms or shapes of support materials (for example, powders, particles, pellets, granules, extrudates, fibers, shells, honeycombs, plates, scrims, fabrics, paper, and the like, and combinations thereof). Particles can be regular in shape, irregular, dendritic, dendrite-free, or the like. Preferred supports include particles, powders, and combinations thereof.

In addition to the nanoparticles, particulate embodiments of nanoparticulate support media can comprise particles of any of a wide range of particle sizes. For example, the nanoparticles and/or nanoparticle agglomerates can be combined with other particulate catalysts or adsorbents to further modify the characteristics of the nanoparticulate support media. Such additives can range in average size, for example, from less than about one-tenth to about ten times the average nanoparticle or nanoparticle agglomerate size. Often, however, the additives are comparable in average size to that of the nanoparticles or nanoparticle agglomerates. Selecting an appropriate size can involve balancing density and catalytic rate against air flow resistance. Generally, a finer size (that is, a smaller particle size) tends to provide not only greater catalytic rate and filter capacity, but also higher air flow resistance.

Preferred nanoparticulate support media include nanoparticulate supports that have multiphasic (for example, biphasic) surfaces. Multiphasic means that the surface of the support has more than one phase (for example, as determined by TEM). Such supports can exhibit enhanced catalytic activity upon gold deposition by PVD.

Representative examples of materials useful (alone or in combination with other materials) as nanoparticulate support media include carbonaceous materials, siliceous materials (for example, silica, silica-titania (including mixtures of silica nanoparticles and titania nanoparticles, nanoparticles of an oxide comprising both silicon and titanium, and the like), silica-alumina, and the like), metal compounds (for example, metal oxides and the like), and the like, and combinations thereof. Useful metal oxides include oxides of one or more of cerium, aluminum, titanium, vanadium, chromium, manganese, cobalt, nickel, copper, zinc, gallium, yttrium, zirconium, niobium, molybdenum, iron, tin, antimony, lanthanum, tungsten, and combinations thereof. Oxides of one or more of calcium, potassium, sodium, magnesium, germanium, strontium, ruthenium, rhodium, palladium, silver, indium, barium, hafnium, thallium, rhenium, platinum, and combinations thereof also can be useful in admixture with one or more of the foregoing oxides.

Examples of useful carbonaceous substances include activated carbon and graphite. Suitable activated carbon particles can be derived from a wide variety of source(s) including coal, coconut, peat, any activated carbon(s) from any source(s), and the like, and combinations thereof.

Preferred materials for use (alone or in combination with other materials) as nanoparticulate support media include aluminum oxides, titania, titania-alumina, silica, titania-silica, activated carbon, binary oxides such as hopcalite ($CuMnO_2$), molecular sieves, and the like, and combinations thereof. Of these, oxides comprising aluminum (preferably, alumina), titanium (preferably, titania), and combinations thereof are particularly preferred. Titania and alumina are commercially available in nanoparticulate forms. Titania is more preferred (most preferably, at least a portion of the titania being in the anatase crystalline form).

In addition to such oxides, activated carbon can be useful as an additional component of the nanoparticulate support medium because, in addition to providing a support for catalytic activity and exhibiting a relatively long service life, carbon can function as an absorbent for noxious gases. Impregnants that augment filtering capabilities can also be easily incorporated into carbonaceous material in accordance with conventional practices. Activated alumina can generally be very robust to aging and heat and therefore useful at elevated temperature.

A particularly preferred nanoparticulate support medium for use in the process of the invention is a composite support medium that can be prepared by adsorbing or adhering a first material (for example, relatively fine material comprising porous or non-porous nanoparticles; preferably, porous nanoparticles or porous agglomerates of porous or non-porous nanoparticles) onto a second material (which can be chemically the same or different from the first material) that is coarser or larger in average size than the first material (for example, larger particles, fibers, honeycomb materials, and the like, and combinations thereof). The first material is referred to herein as "guest" material, while the second, relatively coarser material is referred to herein as "host" material. The amount of guest material generally can be from about 3 percent to about 40 percent by weight (preferably, from about 8 percent to about 20 percent by weight), based upon the total weight of guest material and host material in the composite support medium. As one alternative, catalytically active gold can be deposited onto the guest material before the guest material is combined with the host material. As another alternative, catalytically active gold can be deposited onto the resultant composite support medium during or after formation of the composite support medium.

This guest/host composite structure can provide dramatically higher total exterior surface area while essentially retaining the desirable gas passing characteristics (that is, low pressure drop) of the coarser material. In addition, the bulk of the volume of a catalyst bed can then comprise less expensive, coarser particles, which can be non-porous. Preferably, the host material is porous, however, as this facilitates the application of the guest material and the heating and cooling of the catalyst bed. Both the guest material and the host material can be non-porous, with porosity provided by particle packing only, but, most preferably, the guest material is in the form of porous agglomerates and the host material is porous.

A variety of methods generally can be used to construct the composite support media. In one method, porous or non-porous guest particles can be admixed with one or more adhesion agents in solution, and then the resulting mixture can be combined with coarser host particles. If the host particles are porous, the mixture can be introduced by incipient wetting of the host particles. If the host particles are not porous, the mixture can be admixed with the host particles, and the solution liquid can be removed either concurrent with the mixing or subsequent to the mixing.

In either case, after combining the guest particles, the adhesion agent(s), and the host particles and removing the liquid from the solution, the resulting mixture can be dried and optionally calcined or otherwise heat treated to provide a composite support medium having the guest particles adhered or coated on at least a portion of the surface of the host particles. The calcining temperature can be selected to be sufficient to generate a bond between the adhesion agent and the particles but below the temperature at which the porous particles lose porosity. Generally the calcining temperature can be in the range of about 200° C. to about 800° C. In general, a low temperature can be preferred. Support media comprising carbon generally can be heated at more moderate temperatures (for example, about 120° C. to about 140° C.).

The adhesion agent generally can be included at an amount of about 0.1 to about 50 parts by weight based upon 100 parts by weight of guest material. Examples of adhesion agents include basic metal salts, partially hydrolyzed metal complexes such as partially hydrolyzed alkoxides, hydrous metal oxy-hydroxide nanoparticles, other metal salts, and the like, and combinations thereof. Partially hydrolyzed alkoxide solutions can be prepared by methods well known in the sol-gel art. Useful metal alkoxides include alkoxides of titanium, aluminum, silicon, tin, vanadium, and mixtures thereof. Basic metal salts include nitrate and carboxylate salts of titanium and aluminum. Nanoparticle-sized colloidal materials include colloids of oxides and oxy-hydroxides of aluminum and titanium and oxides of silicon, tin, and vanadium.

In yet another construction method, composite support media can be prepared by physically mixing guest and host particles (for example, by techniques involving mechanical and/or electrostatic mixing). As a consequence of such mixing, the guest and host particles tend to become associated into desired ordered mixtures in which guest particles substantially uniformly coat or are otherwise associated with the surfaces of the host particles. Optionally, one or more liquid ingredients can be included in the mixture, although dry blending with little or no solvent can provide suitable composites. Ordered mixtures and methods of making such mixtures have been described by Pfeffer et al. in "Synthesis of Engineered Particulates with Tailored Properties Using Dry Particle Coating", Powder Technology 117, 40-67 (2001); and by Hersey in "Ordered Mixing: A New Concept in Powder Mixing Practice", Powder Technology 11, 41-44 (1975); the descriptions of which are incorporated herein by reference.

Guest material preferably comprises porous particles, particle agglomerates, or powders that can coat or otherwise become associated with all or a portion of the surfaces of the host material via physical, chemical, electrostatic adhesion, or other means. Representative examples of suitable guest particles include metal oxides such as, for example, titania (preferably wherein at least a portion of the titania is in the anatase crystalline form), zinc oxide, iron oxide, alumina, and tin oxide; silicon oxide; sol-gel-derived particles; zeolite; aerogel particles; and the like; and combinations thereof. Metal oxides and combinations thereof can be preferred (with oxides comprising titanium and combinations thereof being more preferred; and with titania being most preferred).

Preferably, the guest material comprises nanoparticles of about 1 nm to about 30 nm average diameter (more preferably, about 3 nm to about 30 nm; even more preferably about 3 nm to about 15 nm; most preferably, about 3 nm to about 10 nm). The guest material preferably has a high surface area as measured by the BET (Brunauer-Emmett-Teller) method (calculation of the surface area of solids by physical adsorption of nitrogen gas molecules). The surface area of the nanoparticle portion of the guest material is preferably greater than about 35 square meters per gram ($m^2/g$), more preferably greater than about 150 $m^2/g$. and most preferably greater than about 300 $m^2/g$.

The guest material can be present in the form of porous (preferably, nanoporous) aggregates or agglomerates of porous or non-porous nanoparticles. These porous aggregates can have all dimensions in the range of about 0.1 micrometer to about 15 micrometers in average size (more preferably, in the range of about 0.2 micrometer to about 3 micrometers; even more preferably, in the range of about 0.2 micrometer to about 1.5 micrometers; most preferably, in the range of about 0.2 micrometer to about 1.0 micrometer).

The guest particles and/or aggregated guest particles can provide a porous, exposed, high surface area coating on the host particles for the vapor deposition of gold. Resulting composite support media can exhibit multiple levels of porosity (for example, the porosity of the guest particles themselves, as well as the porosity resulting from the spaces between particles).

A variety of materials can be used as the host material of composite support media, either singly or in combination. Examples include a wide range of forms or shapes such as particles, powders, pellets, granules, extrudates, fibers, shells, honeycombs, plates, and the like, and combinations thereof. Host particles can be regular in shape, irregular, dendritic, dendrite-free, or the like. Because preferred embodiments of composite support media will further incorporate porous guest material, the host material need not be, but can be if desired, porous (preferably, nanoporous).

Useful host materials include metal oxides (for example, alumina), carbonaceous material (for example, activated carbon), alumino-silicates, silicates, transition metal oxides, and the like, and combinations thereof. Metal oxides (for example, alumina) and carbonaceous material (for example, activated carbon), and combinations thereof can be preferred, with carbonaceous material being more preferred.

In embodiments in which the host material includes particulate constituents, the one or more kinds of host particles can be larger than the guest material being used and typically independently can have an average particle size (diameter) in the range of about 3 micrometers to about 5000 micrometers, more preferably in the range of about 5 micrometers to about 2000 micrometers. However, larger host particles can be used in some applications. Within such ranges, it can also be desirable that the relative sizes of the host and guest particles are suitable for forming an ordered mixture. Thus, it can be preferred that the ratio of the volume average particle size of the host particles to the guest particles is greater than about 3:1, more preferably greater than about 10:1, and most preferably greater than about 20:1.

A preferred embodiment of host particles includes an activated carbon commercially available under the trade designation "Kuraray GG" from Kuraray Chemical Co., Ltd. (Japan). This material is porous and contains potassium carbonate but is low in halide content. The material is derived from coconuts.

Particle size of the components of the above-described nanoparticulate support media can be measured in any appropriate manner in accordance with conventional practices now or hereafter practiced. For example, the average diameter of nanoparticles can be determined by inspection of TEM information, the average diameter of nanoparticle agglomerates in the range of about 0.1 micrometer to about 25 micrometers can be determined through scanning electron microscopy (SEM), and the average diameter of larger (than about 5 micrometer) particles or agglomerates can be determined by optical microscopy.

Particularly preferred nanoparticulate support media for use in the process of the invention include nanoparticulate metal oxide(s) (preferably, titania); composite support media comprising nanoparticulate metal oxides (preferably, titania) as the guest material(s) and activated carbon as the host material; and combinations thereof.

Deposition Process

Physical vapor deposition refers to the physical transfer of gold from a gold-containing source or target to a support medium. Physical vapor deposition can be viewed as involving atom-by-atom deposition, although in actual practice the gold can be transferred as extremely fine bodies constituting more than one atom per body. The deposited gold can interact with the surface of the support medium physically, chemically, ionically, and/or otherwise.

Physical vapor deposition preferably occurs under temperature and vacuum conditions in which gold is quite mobile and will tend to migrate on the surface of the support medium until immobilized in some fashion (for example, by adhering to a site on or very near the support surface). Sites of adhering can include defects such as surface vacancies, structural discontinuities such as steps and dislocations, and interfacial boundaries between phases or crystals or other gold species such as small gold clusters. Gold deposited by the process of the invention apparently is sufficiently immobilized that the gold can retain a high level of catalytic activity. In contrast, conventional methodologies often allow the gold to coalesce into such large bodies that catalytic activity can be compromised or even lost.

Physical vapor deposition can be carried out in various different ways. Representative approaches include sputter deposition (preferred), evaporation, and cathodic arc deposition. Any of these or other PVD approaches can be used in the process of the invention, although the nature of the PVD technique can impact the resulting catalytic activity.

For example, the energy of the physical vapor deposition technique can impact the mobility of the deposited gold and hence its tendency to coalesce. Higher energy tends to correspond to an increased tendency of the gold to coalesce. Increased coalescence, in turn, tends to reduce catalytic activity. Generally, the energy of the depositing species is lowest for evaporation, higher for sputter deposition (which can include some ion content in which a small fraction of the impinging metal species are ionized), and highest for cathodic arc deposition (which can include several tens of percents of ion content). Accordingly, if a particular PVD technique yields deposited gold that is more mobile than desired, it can be useful to use a PVD technique of lesser energy instead.

Physical vapor deposition preferably is performed while the support medium to be treated is being well-mixed (for example, tumbled, fluidized, milled, or the like) to ensure adequate treatment of support surfaces. Methods of tumbling particles for deposition by PVD are described in U.S. Pat. No. 4,618,525 (Chamberlain et al.), the description of which is incorporated herein by reference. For described methods specifically directed at catalysts see Wise, "High Dispersion Platinum Catalyst by RF Sputtering," Journal of Catalysis 83, 477-479 (1983) and U.S. Pat. No. 4,046,712 (Cairns et al.), the descriptions of which are incorporated herein by reference.

When carrying out PVD on fine particles or fine particle agglomerates (for example, less than about 10 micrometers in average diameter), the support medium is preferably both mixed and comminuted (for example, ground or milled to some degree) during at least a portion of the PVD process. This can assist in maintaining the separation and free flow of the particles or agglomerates during the deposition.

Such comminution, however, may not be desired in those embodiments in which gold is deposited onto the above-described composite support media. Grinding tends to reduce the activity of these composite-based catalyst systems. Thus, when carrying out PVD on composite support media, the speed of agitation can be generally lower than that used when coating other support media (for example, fine particles or fine particle agglomerates). In the case of fine particles or fine particle agglomerates, it can be advantageous for the mixing of the particles to be as vigorous and rapid as possible while still retaining controlled deposition of the gold.

Figure 2:
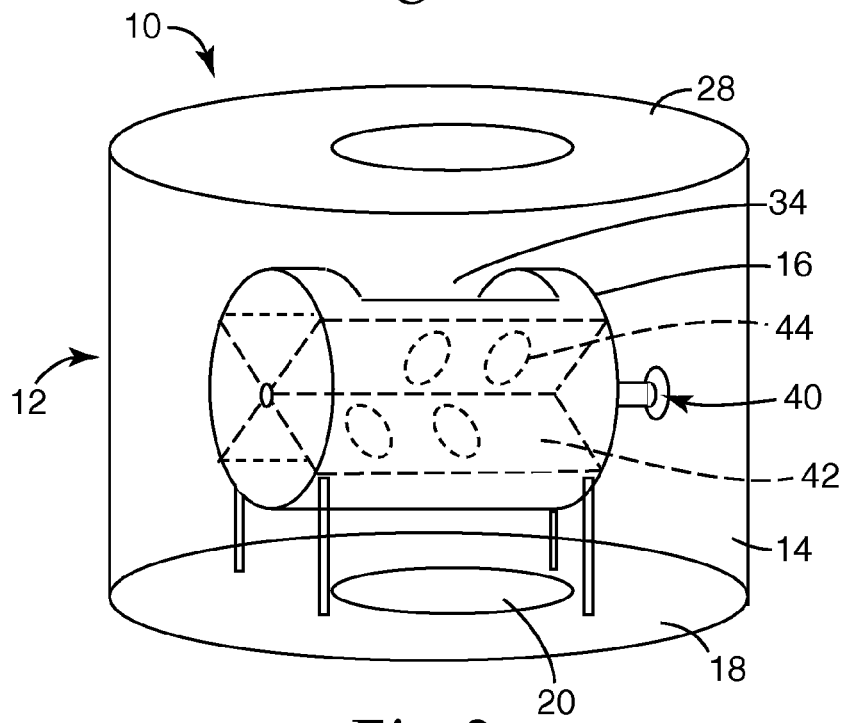
FIG. 2 shows, in perspective view, the apparatus of FIG. 1.

An apparatus 10 for carrying out a preferred embodiment of the process of the invention is shown in FIGS. 1 and 2. The apparatus 10 includes a housing 12 defining a vacuum chamber 14 containing a particle agitator 16. The housing 12, which can be made from an aluminum alloy if desired, is a vertically oriented hollow cylinder (for example, 45 cm high and 50 cm in diameter). The base 18 contains a port 20 for a high vacuum gate valve 22 followed by a six-inch diffusion pump 24 as well as a support 26 for the particle agitator 16. The vacuum chamber 14 is capable of being evacuated to background pressures in the range of $10^{-6}$ Torr.

The top of the housing 12 includes a demountable, rubber L-gasket-sealed plate 28 that is fitted with an external mount, three-inch diameter direct current (dc) magnetron sputter deposition source 30 (a US Gun II, US, INC., San Jose, Calif.). Into the sputter deposition source 30 is fastened a gold sputter target 32 (for example, 7.6 cm (3.0 inch) diameter× 0.48 cm (3/16 inch) thick). The sputter deposition source 30 is powered by an MDX-10 Magnetron Drive (Advanced Energy Industries, Inc, Fort Collins, Colo.) fitted with a Sparc-1e 20 arc suppression system (Advanced Energy Industries, Inc, Fort Collins, Colo.).

The particle agitator 16 is a hollow cylinder (for example, 12 cm long×9.5 cm diameter horizontal) with a rectangular opening 34 (for example, 6.5 cm×7.5 cm). The opening 34 is positioned about 7 cm directly below the surface 36 of the gold sputter target 32, so that sputtered gold atoms can enter the agitator volume 38. The agitator 16 is fitted with a shaft 40 aligned with its axis. The shaft 40 has a rectangular cross section (for example, 1 cm×1 cm) to which are bolted four rectangular blades 42 which form an agitation mechanism or paddle wheel for the support particles being tumbled. The blades 42 each contain two holes 44 (for example, 2 cm diameter) to promote communication between the particle volumes contained in each of the four quadrants formed by the blades 42 and particle agitator 16. The dimensions of the blades 42 are selected to give side and end gap distances of either 2.7 mm or 1.7 mm with the agitator walls 48. Preferred modes of use of this apparatus are described below in the examples.

Physical vapor deposition can be carried out at essentially any desired temperature(s) over a very wide range. However, the deposited gold can be more catalytically active (perhaps due to more defects and/or lower mobility and coalescence) if the gold is deposited at relatively low temperatures (for example, at a temperature below about 150° C., preferably below about 50° C., more preferably at ambient temperature (for example, about 20° C. to about 27° C.) or less). Operating under ambient conditions can be generally preferred as being effective and economical, as no heating or chilling is required during the deposition.

The physical vapor deposition is carried out in an oxidizing atmosphere. Preferably, the oxidizing atmosphere comprises at least one oxygen-containing gas (more preferably, an oxygen-containing gas selected from oxygen, water, hydrogen peroxide, ozone, and combinations thereof, even more preferably, an oxygen-containing gas selected from oxygen, water, and combinations thereof, most preferably, oxygen). The oxidizing atmosphere further comprises an inert sputtering gas such as argon, helium, xenon, radon, or a mixture of two or more thereof (preferably, argon). The total gas pressure (all gases) in the vacuum chamber during the PVD process can be from about 1 mTorr to about 25 mTorr (preferably, from about 5 mTorr to about 15 mTorr). The oxidizing atmosphere can comprise from about 0.05 percent to about 60 percent by weight oxygen-containing gas (preferably, from about 0.1 percent to about 50 percent by weight; more preferably, from about 0.5 percent to about 25 percent by weight), based upon the total weight of all gases in the vacuum chamber.

Optional Process Steps

As mentioned above, the PVD process can be used to deposit other metals (in addition to gold) simultaneously or sequentially or to deposit mixtures of metals by using polyphasic targets, so that catalyst systems can be formed that comprise polyphasic nanoparticles (for example, nanoparticles comprising atomic mixtures of $M_1$ and $M_2$, where $M_1$ and $M_2$ represent different metals) or that comprise combinations of metal nanoparticles (for example, nanoparticle mixtures comprising discrete $M_1$ particles and discrete $M_2$ particles) for multi-function catalysts that can catalyze more than one reaction. These different catalytic functions can be carried out simultaneously in practice. Thus, for example, a catalyst system can be prepared that will oxidize CO and at the same time oxidize $SO_2$ efficiently.

Some modes of practice, particularly those using lower amounts of deposited gold, involve depositing gold via PVD only after the support medium has been impregnated with one or more activating agents and/or other impregnant(s), dried, and optionally calcined or otherwise heat treated. The use of PVD greatly expands the range of activating agents that can be used in combination with catalytically active gold to include materials that would otherwise react or be too soluble in solution when wet methods are used to deposit gold.

Thus, the process of the invention optionally can include the application of one or more activating agents to the support medium to enhance the catalytic performance of the resulting catalyst system. As used herein, an activating agent refers to any material that is generally not catalytic by itself yet can enhance the performance of a catalyst when both the activating agent(s) and the catalyst are incorporated into the system.

In preferred embodiments, activating agent(s) can be incorporated into the desired support before, during, or after gold deposition. Preferably, this incorporation occurs prior to gold deposition. In the case of composite support media comprising guest material provided on host material, the activating agent(s) can be incorporated into the host material and/or the guest material.

A preferred class of activating agents includes one or more metal salts. Water soluble salts such as alkali metal salts and/or alkaline earth metal salts are inexpensive, readily available, and easily incorporated into catalytic systems. Such salts can be potent activators for gold-based catalysis, especially when used to activate porous carbon support media.

Examples of useful metal salts include salts of the alkali or alkaline earth metals (for example, lithium, potassium, sodium, magnesium, calcium, and/or barium). Other useful metals include Cs, Rb, and the like. Combinations of any of these metal salts can be used. In some embodiments, the activating agent can comprise at least one alkali metal salt and at least one alkaline earth metal salt, wherein the weight ratio of the alkali metal salt to the alkaline earth metal salt is in the range of about 1:19 to about 19:1, preferably about 1:3 to about 3:1.

The metal salts can include any suitable counter anion(s). Examples include nitrate, hydroxide, acetate, carbonate, and the like, and combinations thereof. Carbonate and hydroxide can be preferred anions, as such salts are generally safe and convenient to handle and form very active supports. If the nitrate anion is included, the substrate desirably can be calcined to a sufficiently high temperature to decompose the nitrate anion to activate the support. Carbonate is even more effective when used in combination with an alkali metal or alkaline earth metal. Accordingly, preferred activating agents comprise a carbonate salt (more preferably, an alkali metal carbonate salt or an alkaline earth metal carbonate salt). Potassium carbonate is a preferred salt, as it can be very effective when used on activated carbon with a gold catalyst, as well as when used on other types of supports (for example, alumina).

Another advantageous class of activating agents includes alkoxides, particularly metal alkoxides referenced above with respect to forming nanoporous surface features on less porous host particles. Preferred alkoxides include alkoxides of titanium and aluminum. Alkoxides can be used in combination with one or more of the water soluble salts described above. When the two kinds of materials are used together, they can be impregnated onto the support at the same time or sequentially in any order, although it can be preferred that the alkoxide(s) be impregnated onto the support after the impregnation of the salt(s).

The amount of activating agent used in the heterogeneous catalyst system can vary over a wide range and will depend upon a variety of factors including the nature of the activating agent, the amount of gold to be incorporated into the system, the nature of the support, and the like. Generally, if too little activating agent is used, the potential benefits of using the activating agent may not be fully attained. On the other hand, beyond some point, using additional activating agent may not provide significant additional benefit and may undermine catalytic performance to some degree.

Accordingly, as suggested guidelines, representative embodiments of the process of the invention can include the use of, for example, about 0.25 to about 15 (preferably, about 1 to about 5) weight percent of activating agent, based upon the total weight of activating agent and support medium. When one or more water soluble salts and one or more alkoxides are used in combination, the molar ratio of the salt(s) to alkoxide(s) can be, for example, in the range of about 1:100 to about 100:1 (preferably, about 1:5 to about 5:1).

The activating agent can be incorporated into the heterogeneous catalyst system in a variety of different ways. For example, the support medium can inherently include a suitable activating agent. Activated carbon derived from coconut shell naturally includes potassium carbonate as a constituent. This type of activated carbon (for example, Kuraray GG carbon, available from Kuraray Chemical Company, Ltd., Japan) can provide an excellent support for gold catalyst without requiring additional activating agent(s).

Unlike Kuraray GG carbon, many other desirable supports do not naturally include an activating agent. Consequently, it can be desirable to incorporate an activating agent comprising one or more constituents into the desired support. Such incorporation can occur in any desired manner. Incipient wetness impregnation is one suitable technique. This can involve slowly adding a solution comprising the desired activating agent to dry support media with mixing. If more than one species of activating agent is to be added, these can be added together, separately, or in overlapping fashion. After impregnation, the support media can be dried and optionally calcined (thermal treatment).

One or more impregnants or other agents can be incorporated into the nanoparticulate support medium to enhance the filtering capabilities of the resulting catalyst system. When a composite support medium is utilized, such impregnants can be incorporated in the guest and/or host material. Most preferably, particularly when the host comprises a carbonaceous material such as activated carbon particles, the impregnants are incorporated at least into the carbonaceous material.

Examples of useful impregnants include one or more metals, metal alloys, intermetallic compositions, and/or compounds containing one or more of Cu, Zn, Mo, Ag, Ni, V, W, Y, Co, and the like, and combinations thereof. The metals typically can be impregnated as salts and may be converted to other forms (for example, oxides) during some modes of impregnation.

The selection of which one or more transition metal compounds to incorporate into the catalyst system can depend upon the desired range of filtering capabilities, as each of the various transition metals tends to provide protection against particular air contaminants. For example, Mo, V, and Y or W independently help to filter gases such as cyanogen chloride and hydrogen cyanide from air streams when used in combination with a Cu impregnant.

Figure 4:
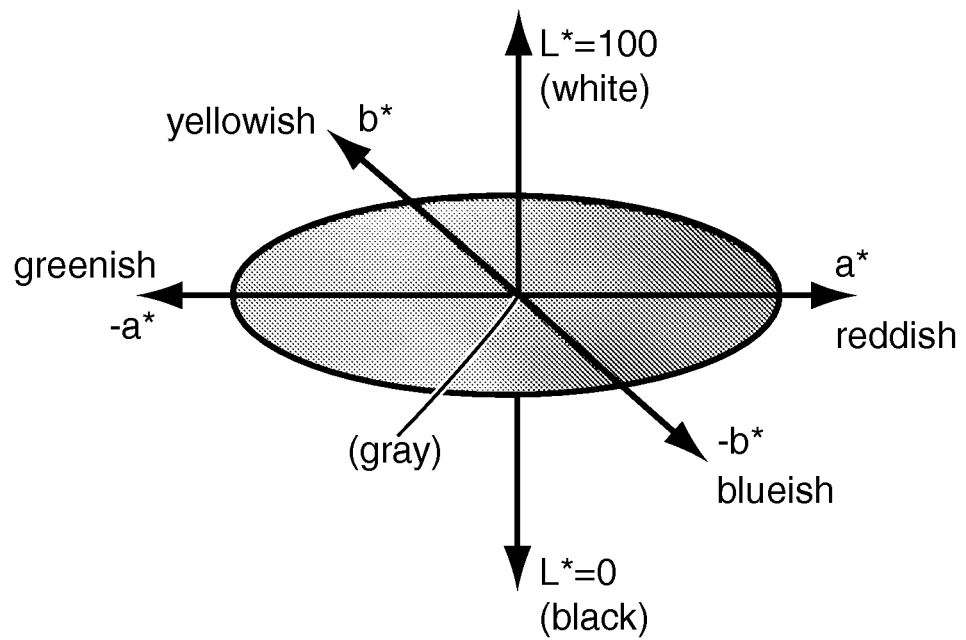
FIG. 4 shows a schematic drawing of a color tree that constitutes an arrangement of colors according to a plot of the three CIE color coordinates (L*, a*, and b*).

Impregnants can be incorporated into the catalyst system in accordance with conventional practices. Such impregnants can typically be provided as salts, oxides, carbonates, and the like and can be impregnated via solution processing, sublimation processing, fluidized bed processing, and the like. Preferably, such impregnation occurs prior to gold deposition. The amount of impregnant utilized can vary widely (for example, from about 0.01 to about 20 weight percent, based upon the total weight of impregnated support medium), depending upon the nature of the impregnant, the nature of the support, and the properties desired.

Deposition of gold preferably occurs via PVD after impregnation (if any), coating of host material or structures with at least one guest material (with respect to composite support media, when used), drying (if needed or desired), and optional calcining. Since gold is active right away when deposited via PVD, there is no need to heat treat the system after gold deposition as is the case with some other methodologies. Such heat treating or calcining can be carried out if desired, however, to enhance catalyst activity.

In general, thermal treatment can involve heating the impregnated support at a temperature in the range of about 125° C. to about 1000° C. for a time period in the range of about 1 second to about 40 hours, preferably about 1 minute to about 6 hours, in any suitable atmosphere such as air, an inert atmosphere such as nitrogen, carbon dioxide, argon, a reducing atmosphere such as hydrogen, and the like. The particular thermal conditions to be used can depend upon factors including the nature of the support and the nature of the impregnants(s).

Generally, thermal treatment can be carried out below a temperature at which the constituents of the impregnated support would be decomposed, degraded, or otherwise unduly thermally damaged. Depending upon factors such as the nature of the support, the activating agents, the amount of gold, and the like, catalytic activity can be compromised to some degree if the system is thermally treated at too high a temperature.

Catalyst Systems and Characterization Thereof

Characterization of the catalyst systems can be accomplished using transmission electron microscopy, as is well-known in the catalyst art. TEM analysis has shown that, upon deposition on a nanoparticulate support, gold atoms can migrate by diffusion or other mechanism some distance into the support before being immobilized, so as to provide gold nanoparticles and/or atom clusters in the pores of the support.

In most preferred embodiments, there are regions of the catalyst system where gold nanoparticles that are greater than about 1.5 nm in at least one dimension and less than or equal to 5 nm in all dimensions are present in high number density. For example, the nanoparticle number density as measured by transmission electron microscopy (see the description below) can be greater than about 3 nanoparticles within a 100 $nm^2$ region, more preferably greater than about 4 nanoparticles within a 100 $nm^2$ region, and most preferably greater than about 5 nanoparticles within a 100 $nm^2$ region. While not wishing to be bound by theory, the dense packing of the nanoparticles may allow more active nanoparticles to initiate activity in less active nanoparticles during use.

In embodiments comprising fine-nanoscale gold on composite support media, the gold can be present in several different morphologies. TEM examination of thin cross-sections of granular composite support media cut perpendicular to its guest nanoparticle coating has shown the presence of nanoparticulate gold at various depths in the nanoparticle guest coating up to and including in some cases the surface of the host particle. The gold is not, however, generally uniformly distributed throughout the guest nanoparticle coating.

In such embodiments, the gold can often be enriched on those guest nanoparticles and guest nanoparticle agglomerates that comprise the outermost region of the guest nanoparticle coating. Within the guest nanoparticle agglomerates, the distribution of gold nanoparticles is also not generally uniform. A major portion of the gold on each guest nanoparticle agglomerate can be found in the outer region of the agglomerate, with the highest density of the gold usually being on the surface that is directed away from the host particle.

In such embodiments, a majority of the surfaces of the guest nanoparticle agglomerates on the outer perimeter of the guest nanoparticle coating can comprise discrete gold nanoparticles having average particle sizes less than about 3 nm in diameter. In these surface regions, ultra-nanoscale gold can also be observed. There can also be thin regions (usually between about 3 and about 10 nm and, in relatively rare cases, up to about 20 nm in thickness) of higher gold loading at the surface of certain guest nanoparticle agglomerates, where the gold nanoparticles have merged to form a granular gold film. In most cases, these granular films can be less than about 200 nm in width, but occasionally wider films, having widths up to about 400 nm, have been observed.

In terms of color, gold in larger scale size regimes has a yellowish color. However, in the nanoscale size regimes in which gold is generally catalytically active, the color of gold can become a reddish-pink and then purplish-blue when viewed under white light, although very small clusters of gold and gold surface species can be colorless. Such colorless species can be quite catalytic, and the presence of such colorless species is usually accompanied by some colored nanoparticles of gold. Consequently, if a gold sample exhibits a reddish-pink to purplish-blue color and/or is colorless, it is possible that the sample is catalytically active.

Colorimetry measurements can be used to quantify and describe the human color perception. Thus, the chromatic properties of catalyst systems produced by the process of the invention can be quantitatively described by reference to color measurement standards.

The basis for colorimetry was established by CIE (Commission Internationale de l'Eclairage, the International Commission on Illumination) and remains the only internationally accepted metric for color measurement. There are three types of cones in the human eye, which have spectral sensitivities corresponding to the colors red (R), green (G), and blue (B) (the RGB primaries). CIE transformed the RGB primaries to the imaginary tristimulus primaries (XYZ), which are combinations of the RGB primaries determined mathematically as the integrals of three distribution functions covering the visible spectrum with the reflectance (or transmittance) curve and the energy distribution of the light source.

Using the tristimulus primaries, color can be expressed in a two-dimensional plane called chromaticity. To allow an accurate specification of object colors, however, CIE recommended three-dimensional uniform color spaces incorporating 'lightness' into the chromaticity plane.

The three color attributes hue (the main color or color name), chroma (related to color purity), and lightness (the percentage of incident light reflected by a surface; thus, the blackness, grayness, or whiteness of a color) can be designated by the set of color coordinates 'CIELAB' (L*, a*, b*), which is used as an industry standard color descriptor. In the color space, the coordinate L* indicates lightness, and a* and b* are chromaticity coordinates. Increasingly positive values of a* signify a deepening chroma of the hue red, and increasingly negative values for a* indicates a deepening chroma of the hue green. Along the b* axis, increasingly positive values denote a deepening chroma of the hue yellow, and increasingly negative values denote a deepening chroma of the hue blue. A plot of the three CIE color coordinates (shown in FIG. 4) forms a three-dimensional color space or "color tree."

For colors with no chroma (white, gray, and black), a*=b*=0. The chroma ($C^*_{ab}$) and the hue angle ($h_{ab}$) can be calculated from the values for a* and b* by using the following formulas:

$$C^*_{ab} = (a^{*2} + b^{*2})^{1/2}$$

$$h_{ab} = \tan^{-1}(b^*/a^*)$$

Figure 5:
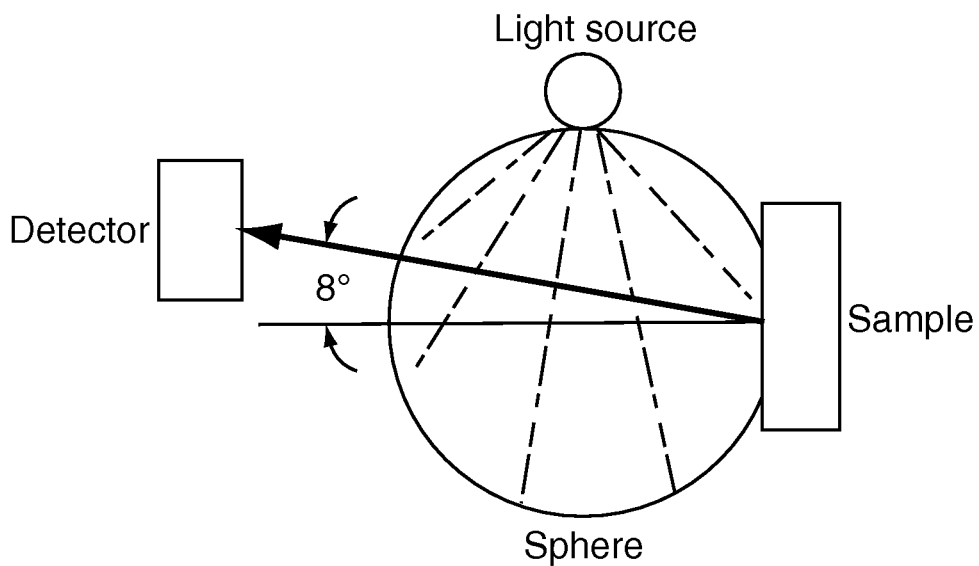
FIG. 5 schematically shows the total reflectance measurement geometry (d/8°) that was used to assess the color characteristics of catalyst systems prepared by the processes described in the Examples section below.

Object color can be determined by total (diffuse plus specular) reflectance measurements and expressed in terms of the three CIE color coordinates. Spectroreflectometers can measure the total reflectance of a sample under a given set of geometrical conditions. CIE has defined four measurement geometries for evaluating color and/or appearance. To exclude the effects of surface smoothness characteristics (which can affect the appearance of an object), color measurements can be made by using an integrating sphere type geometry. A "d/8°" geometry is commonly utilized (diffuse hemispherical illumination and 8° viewing angle, as shown in FIG. 5) for making color comparisons between different objects or samples.

Surprisingly, preferred gold-bearing titania catalyst systems produced by the process of the invention (particularly when the oxidizing atmosphere comprises oxygen or ozone) comprising at least about one weight percent fine-nanoscale gold on nanoparticulate titania (preferably less than about 10 weight percent gold, based upon the total weight of gold and titania) exhibit colors that are dramatically less purple or blue and, rather, more gray than corresponding catalyst systems produced by the same PVD process (same amount of gold, same type and amount of titania, same deposition technique for same amount of time) but without the use of an oxidizing atmosphere. Such preferred gold-bearing titania catalyst systems of the invention thus have greater L* values (greater lightness or brightness; L* greater than about 64) and much lower values of a* and b* (both being less than about zero) than the corresponding catalyst systems (and than prior gold-bearing titania catalyst systems produced by non-PVD processes, which have been described in the art as being blue to purple in color). Preferred gold-bearing titania catalyst systems of the invention, even when further comprising host material such as carbon, exhibit similar grayish color shifts (although different values of the three color coordinates, due to the presence of the host material) relative to corresponding catalyst systems produced by PVD (same amount of gold, same types and amounts of titania and host material, same deposition technique for same amount of time) but without the use of an oxidizing atmosphere.

TEM examination has shown that catalyst systems prepared by sputtering gold onto nanoparticulate titania comprise both fine-nanoscale and ultra-nanoscale gold, regardless of whether the sputtering is carried out in argon only or in an oxidizing atmosphere. In addition, X-ray photoelectron spectroscopy of catalyst systems produced in both types of atmospheres has shown no evidence of the presence of any cationic gold. Thus, while not wishing to be bound by theory, the color differences described above may indicate that sputtering gold onto nanoparticulate titania in an oxidizing atmosphere creates a unique interaction between the gold and the titania that is not created when the sputtering is carried out without an oxidizing atmosphere. The observed performance enhancements described herein may be due to this interaction.

Articles Comprising the Catalyst Systems

The catalyst systems produced by carrying out the process of the invention can find application in numerous areas including the treatment of automobile exhaust, in hydrogenation catalysis, as catalysts for the oxidation of hydrocarbons, as catalysts for the removal of oxides of nitrogen, in sensors for the detection and measurement of gases and vapors, in CO removal from inhabited areas, and the like. In particular, the catalyst systems can be useful in respiratory protection articles (for example, respirators, face masks, collective protection devices, room air filters, escape hoods, and the like) for the removal of hazardous CO or other gases from breathing air.

One embodiment of such a respiratory protection article is a respiratory protection device having an interior portion that generally encloses at least the nose and mouth of a wearer, an air intake path for supplying ambient air to the interior portion, and a porous sheet article disposed across the air intake path to filter such supplied air, the device further comprising a catalyst system of the invention (or a catalyst system produced by the process of the invention) disposed across the air intake path so as to interact with the supplied air. Another embodiment of such a respiratory protection article is a replaceable filter element for a respiratory device, the element comprising a support structure for mounting the element on the device, a housing and a porous sheet article disposed in the housing so that the element can filter air passing into the device, the replaceable filter element further comprising a catalyst system of the invention (or a catalyst system produced by the process of the invention) also disposed in the housing so that the catalyst system can interact with the air passing into and through the device.

For example, in preferred articles, the above-described composite support media can be coated onto at least a portion of the surfaces of filtration media arrays such as, for example, those described in U.S. Pat. No. 6,752,889 (Insley et al.; the description of which is incorporated herein by reference) or those commercially available under the trade designation 3M™ High Air Flow (HAF) filters (available from 3M Company, St. Paul, Minn.). Such filtration media arrays generally include a plurality of open pathways, or flow channels, extending from one side of the media to the other. Even if the composite support media coat only the surfaces of these channels, leaving large open volumes through the channels for air streams to pass, it has been found that substantially all CO in air streams passing through the media can be catalytically oxidized with essentially no pressure drop. Most preferably, the composite support media comprise titania guest particles coated onto carbon host particles (such as the above-described Kuraray GG activated carbon particles).

EXAMPLES

Objects and advantages of this invention are further illustrated by the following examples, but the particular materials and amounts thereof recited in these examples, as well as other conditions and details, should not be construed to unduly limit this invention.

Characterization and Test Methods

Transmission Electron Microscopy (TEM)

Test samples of catalyst systems comprising composite support media were prepared as follows: catalyst particles were embedded in 3M™ Scotchcast™ Electrical Resin #5 epoxy resin (available from 3M Company, St. Paul, Minn.) in disposable embedding capsules, and the resin was vacuum impregnated and allowed to cure at room temperature for 24 hours.

For each sample, a random, embedded granule was trimmed (with a stainless steel razor blade previously cleaned with isopropyl alcohol) down to the middle surface region of the granule such that most of the granule was cut away on one side, leaving epoxy on the other side. A small trapezoid-shaped face (less than a half millimeter on a side) was selected and trimmed such that the epoxy/granule interface was left intact. The long direction of this interface was also the cutting direction. A Leica Ultracut UCT microtome (Leica Microsystems Inc., Bannockburn, Ill.) was used to cross-section the face. The face was first aligned such that the granule surface was perpendicular to the knife edge. Sections approximately 70 nm thick were cut at a speed of 0.08 mm/second. These sections were separated by floating onto deionized water and collected using a microtomy hair tool and picked up using a "Perfect Loop" (loop distributed by Electron Microscopy Sciences, Fort Washington, Pa.). Samples were transferred via this loop to a 3 mm diameter, 300 mesh copper TEM grid with carbon/formvar lacey substrate. The regions of interest (intact, cleanly cut specimens showing the interfacial region) that lay over the holes in the substrate were imaged and analyzed.

To prepare catalyst systems comprising non-composite, nanoparticle powder support media for TEM examination, the powder was dispersed in methanol, and a small drop of the resulting dispersion was allowed to contact a TEM grid. Excess methanol was removed, and the resulting catalyst system test sample was fully dried prior to examination.

Images were taken at various magnifications (50,000× and 100,000×) in a transmission electron microscope (TEM; H-9000 available from Hitachi High Technologies America, Pleasanton, Calif.) at 300 KV accelerating voltage using a Gatan CCD camera and Digital Micrograph software (Gatan Inc., Warrenton, Pa.). Representative regions (for example, regions selected wherein the interface of the catalytic surface was clearly displayed in a fashion perpendicular to the surface of the sample) were imaged. Numerous (for example, more than 10) interfacial regions were examined.

Gold nanoparticle number density was determined by TEM by counting the number of gold nanoparticles in a very thin sample section of measured area. To make this determination, sample areas were selected that were suitably thin (less than about 10 nm), and the areas were imaged at 200,000 X or higher. The number of clearly-defined gold nanoparticles having all dimensions less than or equal to 5 nm in size within a geometrically measured area were counted, and the number of nanoparticles observed per 100 nm$^2$ of area determined. The gold nanoparticle number density was defined as the number of nanoparticles counted in a 100 nm area. The minimum area of examination for each determination was 300 nm$^2$.

Colorimetry

The CIE L*, a*, and b* values exhibited by catalyst system samples were determined using a Microflash Model No. 100 spectrophotometer (Datacolor International, Lawrenceville, N.J.). The spectrophotometer was calibrated with a standard white background (Datacolor International white calibration standard serial no. 2508 comprising pressed polytetrafluoroethylene (PTFE) powder) as a reflectance standard. Each sample was spread on a white sheet of paper and was pressed with a glass plate so as to be relatively flat. Each sample was at least about 5 mm in thickness and sufficiently large in size to essentially completely cover the opening of the spectrophotometer (so that the measured reflectance would be that of the sample rather than that of the background sheet of paper). Total reflectance measurements were made on each sample in at least 3 different locations using a d/8° geometry (shown in FIG. 5) and were averaged. The spectrophotometer provided lightness values (L*) from 0 to 100 (with a value of 0 being black and 100 being white), chromaticity coordinate values for a* from −60 to +60 (with −60 being green and +60 being red), and chromaticity coordinate values for b* from −60 to +60 (with −60 being blue and +60 being yellow).

Carbon Monoxide (CO) Challenge Testing

Figure 3:
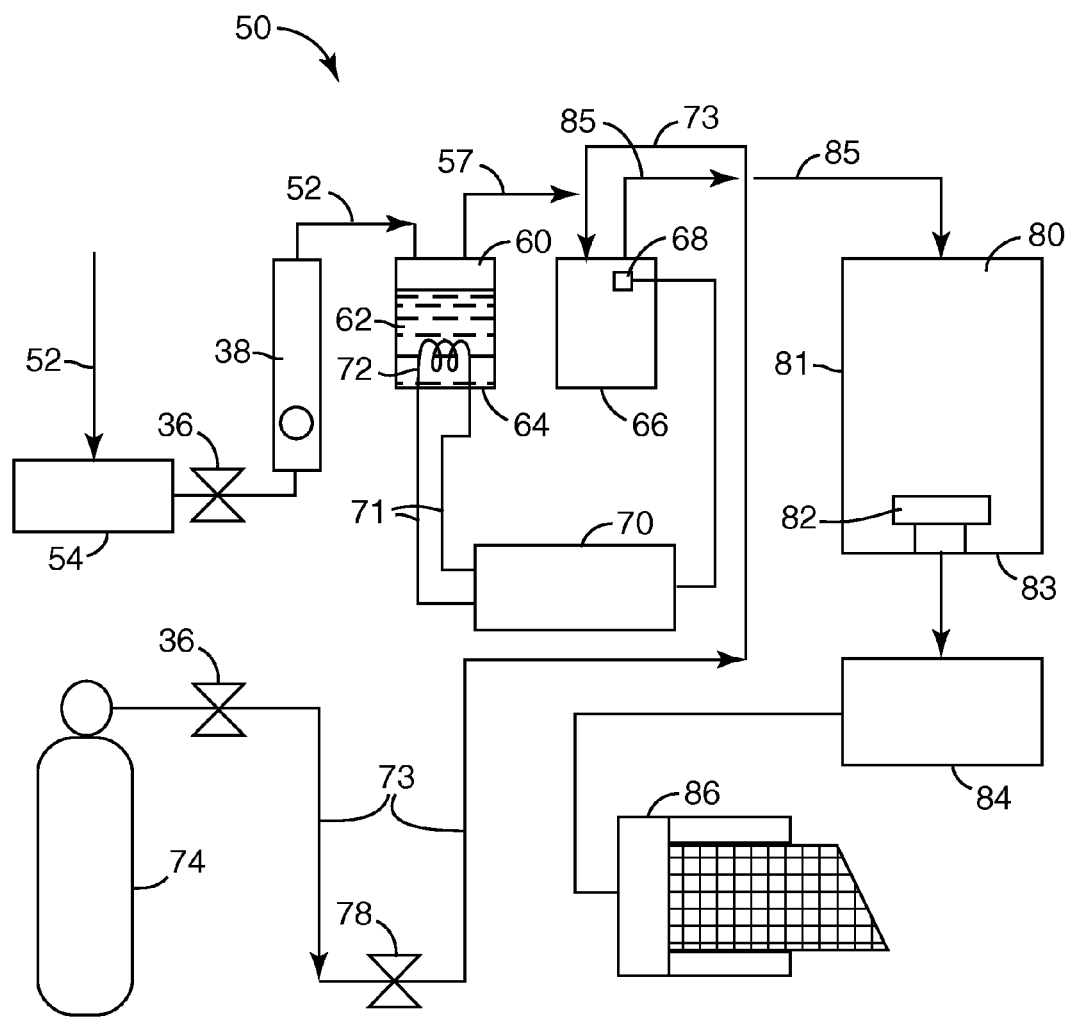
FIG. 3 schematically shows a testing system that was used to assess the carbon monoxide oxidation catalysis characteristics of catalyst systems prepared by the processes described in the Examples section below.

FIG. 3 shows testing system 50 that was used to subject catalyst system samples to CO challenges to assess their performance as CO oxidation catalysts. High-pressure compressed air from supply line 52 was reduced in pressure, regulated, and filtered by regulator 54 (3M™ Model W-2806 Air Filtration and Regulation Panel, 3M, St. Paul, Minn.) to remove particulates and oils. A regulator valve 36 (Hoke Inc., Spartanburg, S.C.) was used to set a desired main air flow rate as measured by Gilmont™ flow meter 38 (Barnant Co, Barrington, Ill.) with a range of 0 to 90 liters per minute (LPM). Flow meter 38 was calibrated using a dry gas test meter (American Meter, Model DTM-325; not shown). Unless otherwise indicated, the main air flow rate used was 64 liters per minute (LPM).

The main air flow passed through headspace 60 above heated distilled water bath 62 of vessel 64 and then passed via lines 57 and 73 into 500 mL mixing flask 66. Relative humidity (RH) in the mixing flask was monitored using RH sensor 68 (Type 850-252, General Eastern, Wilmington, Mass.). RH sensor 68 provided an electrical signal to humidity controller 70 (an Omega Engineering PID controller series CN1200 from Omega Engineering Inc., Stamford, Conn.) that delivered power via lines 71 to submerged heater 72 to maintain the relative humidity at a set point. Unless otherwise indicated, the relative humidity was controlled at greater than 90 percent (%).

Cylinder 74 of carbon monoxide (Aeriform, Houston, Tex., 98.5%) equipped with a regulator valve 36 suitable for CO service provided a regulated flow of CO gas via line 73. Gilibrator™ bubble flow meter (Sensidyne, Inc., Clearwater, Fla.) measured volumetric CO flow rate in the range 20 mL/minute to 6 L/minute. Stainless steel, fine metering valve 78 (Swagelok Co, part SS-SS2, Solon, Ohio) was used to set a desired CO flow rate. The metered CO was combined with the humidified air in mixing flask 66. This system could deliver mixtures of CO and humidified air at concentrations from about 1000 parts per million (ppm) CO to about 20,000 ppm CO at flow rates from about 15 L/minute to about 80 L/minute at RH values from about 5% to approximately 95%. More dilute mixtures for detector calibration were generated by replacing carbon monoxide cylinder 74 with a cylinder of a certified mixture of CO in air or nitrogen (typically from 500 to 5000 ppm CO; Quality Standards, Pasadena, Tex.).

The combined gas stream then flowed into inverted, 12-quart, stainless steel beaker 81 with a 29/42 outer joint welded into the top closably engaging support platform 83 to form test chamber 80. Inside beaker 81 was test fixture 82. Beaker 81 was sealed to support platform 83 using a foam gasket (not shown). Two clamps (not shown) ensured a tight seal to support platform 83. Beaker 81 could be removed to allow catalyst system test samples to be placed inside for testing and to be taken out after testing was complete. Support platform 83 was equipped with an inner 29/42 tapered fitting (not shown) onto which fixture 82 containing a catalyst sample to be tested was mounted. A drawing of fixture 82 is shown in FIG. 2 of ASTM Standard Guide for Gas-Phase Adsorption Testing of Activated Carbon D5160-95.

An SR18610C gas chromatograph (SRI Instruments, Torrance, Calif.) equipped with a gas sampling valve and a methanizer/flame ionization detector was used to measure the concentration of CO at the outlet of test chamber 80. A diaphragm pump (UNMP830 KNI, KNF Neuberger Inc., Trenton, N.J.) continuously drew approximately 50 mL/minute of gas from the outlet through the gas sampling valve of the gas chromatograph (GC). Periodically the valve injected a gas sample onto a 3 ft (91.4 cm) 13× sodium alumino-silicate molecular sieve column. CO was separated from air and its concentration measured by the methanizer/flame ionization detector (minimum detectable CO concentration less than 1 ppm). The GC was calibrated using CO in air mixtures generated using the test system described above. Results of this calibration agreed to within 3% of those from certified standard CO in air or nitrogen mixtures in the range from 500 to 5000 ppm CO (Quality Standards, Pasadena, Tex.). Each CO analysis took about 3 minutes. After completion of the analysis, another gas sample was injected onto the column and the analysis repeated.

Catalyst system samples were sieved to remove fine particles prior to testing. Unless otherwise specified, samples were sieved to remove particles finer than 25 mesh (0.707 mm) using ASTM E 11 U.S. Standard Sieves. In order to keep CO conversion below 100%, the catalyst system was diluted with a material catalytically inactive for CO oxidation under the conditions of the test. The material used was granular activated carbon (type GG carbon 12×20 US mesh (1.68 mm×0.841 mm), Kuraray Chemical Company, Ltd., Osaka, Japan). 15 mL of the catalyst system was loaded into a graduated cylinder using the method described in ASTM D2854-96 Standard Method for Apparent Density of Activated Carbon. The 15 mL catalyst system sample was then added to 10.0 g of the activated carbon contained in a 500 mL Erlenmeyer flask. The flask was capped and then shaken to mix the two components. The resulting mixture was then loaded into 8.89 cm (3.5 inch) inner diameter aluminum test fixture 82. The fixture was loaded with the mixture using a snowstorm filling technique in which the mixture fell into test fixture 82 through a loading column containing screens to evenly distribute the mixture across the bed of the fixture. Typical bed depth was approximately 0.6 cm (0.25 inch). To begin the test, test fixture 82 containing the mixture was placed on the 29/42 fitting on support platform 83. Beaker 81 was replaced and sealed to support platform 83. Outlet CO concentration measurements began when the CO/air mixture was introduced into test chamber 80. Measurements continued for a specified time period, typically 30 minutes.

Examples 1-6 and Comparative Example 1

Preparation of Nanoparticulate Support Media

Composite nanoparticulate support media were prepared essentially according to the method described in International Patent Publication No. WO2006/074126 A2 (3M Innovative Properties Company; Brady et al.). About 3.4 kg of anatase $TiO_2$ (Hombifine N; obtained from Sachtleben Chemie GmbH, Germany; average primary particle size less than 10 nm; average surface area greater than 300 $m^2/g$; average agglomerate size approximately 1 micrometer) was dispersed in 35 kg of deionized water. The resulting slurry was mixed with 25 kg of 12×20 mesh (1.68 mm×0.841 mm) activated carbon granules (Kuraray GG; obtained from Kuraray Chemical Company, Ltd., Osaka, Japan; potassium carbonate-containing) and rotated in a steel reactor at 1 revolution per minute (rpm) and dried using a heater. The resulting dried support media comprised relatively high surface area $TiO_2$ coated on activated carbon granules (about 10-13 percent by weight of $TiO_2$, based on the total weight of the dried support media).

Gold Deposition

A series of samples (each about 140 g) of the dried support media was further dried in an oven at 150° C. for 24 hours to remove residual water. Each resulting dried sample was placed while hot into the PVD apparatus described above in the detailed description having a particle agitator with a blade gap of 2.7 mm. The vacuum chamber of the apparatus was then evacuated to a background pressure of about $5 \times 10^{-5}$ Torr, and gas comprising argon sputtering gas was admitted to the chamber at a pressure of about 10 mTorr.

The gas used for the sample of Comparative Example 1 was solely argon sputtering gas, and various oxidizing atmospheres comprising argon were utilized for the samples of Examples 1-6. The oxidizing atmospheres were created by introducing oxygen to the vacuum chamber along with the argon sputtering gas. A mass flow controller with read out (obtained from MKS Instruments, Inc., Wilmington, Mass.) was used to control the flow rates of argon and oxygen to the vacuum chamber. The argon flow rate was kept at 100 standard cubic centimeters per minute (sccm). The oxygen flow rate for Examples 1-6 was 1.0, 3.0, 5.0, 7.0, 9.0, and 10.0 sccm, respectively. The total gas pressure during the sputtering process was maintained at 10 mTorr by adjusting the gate valve opening to the vacuum (diffusion) pump. The resulting oxidizing atmospheres had oxygen levels up to 8 weight percent (based upon the total weight of oxygen and argon).

The gold deposition process was then carried out by applying power to the cathode of the apparatus for a pre-set period of time, with its particle agitator shaft and holed blades being rotated at 4 rpm during DC magnetron sputter coating of gold at a controlled power of 0.12 kW. The duration of sputter coating was 1 hour. After the sputter coating was completed, the vacuum chamber was vented with air to ambient conditions, and the resulting gold-coated sample was removed from the PVD apparatus and sieved through a 25 mesh (0.707 mm) screen to separate fine particulates generated during the process. The amount of gold that had been deposited on the sample was determined by weighing (both before and after the deposition process) the gold sputtering target that was utilized. In general, about 20 percent of the weight loss of the target represented gold deposited on the sample (based on inductively coupled plasma analysis).

Color Analysis

Colorimetry measurements were performed on each gold-coated sample using the procedure described above. The results are shown in Table 1 below. Even at low oxygen introduction (for example, Example 1), the a* parameter was significantly reduced in comparison to the sample for which no oxygen was present (Comparative Example 1). For Examples 1-6, a monotonic increase in lightness (L*), decrease in a*, and increase in b* generally was observed as oxygen concentration increased.

TABLE 1

| Example No. | Sputter Atmosphere: Ar (sccm)/$O_2$ (sccm) | L* | a* | b* |
| --- | --- | --- | --- | --- |
| C-1 | 100/0 | 42.89 | 1.64 | −2.10 |
| 1 | 100/1.0 | 46.72 | 0.52 | −1.92 |
| 2 | 100/3.0 | 47.14 | −0.65 | −1.82 |
| 3 | 100/5.0 | 48.40 | −0.82 | −1.71 |
| 4 | 100/7.0 | 50.29 | −1.10 | −1.54 |
| 5 | 100/9.0 | 50.44 | −1.18 | −1.16 |
| 6 | 100/10.0 | 48.36 | −1.19 | −1.37 |

Carbon Monoxide Testing

Each gold-coated sample was subjected to carbon monoxide (CO) oxidation catalyst testing by using the above-described procedure with a 3600 ppm CO challenge, a flow rate of 64 liters per minute, and 92 percent relative humidity. The results are shown in Table 2 below. Enhanced catalytic performance generally was observed for the samples sputtered in an oxidizing atmosphere (Examples 1-6) relative to that sputtered in argon alone (Comparative Example 1), even though less gold appeared to have been deposited in the oxidizing atmospheres.

TABLE 2

| Example No. | Oxygen Flow Rate During Sputtering (sccm) | Weight Loss of Gold Sputter Target (g) | Percent CO Conversion at Various Times | | | | |
|---|---|---|---|---|---|---|---|
| | | | 0.5 minutes | 5 minutes | 10 minutes | 20 minutes | 30 minutes |
| C-1 | 0 | 3.71 | 90.7 | 90.4 | 90.1 | 89.6 | 88.8 |
| 1 | 1.0 | 3.55 | 93.7 | 93.8 | 93.2 | 92.7 | 91.7 |
| 2 | 3.0 | 3.31 | 96.3 | 96.1 | 95.5 | 95.1 | 94.4 |
| 3 | 5.0 | 3.22 | 97.3 | 97.6 | 97.6 | 97.4 | 97.1 |
| 4 | 7.0 | 3.10 | 90.6 | 91.7 | 92.5 | 92.8 | 92.5 |
| 5 | 9.0 | 3.00 | 93.7 | 93.8 | 93.1 | 92.6 | 91.9 |
| 6 | 10.0 | 3.02 | 95.6 | 95.2 | 94.6 | 94.0 | 93.1 |

TEM Analysis

The gold-coated sample of Example 5 was examined by TEM using the microtome method of sample preparation. The sample was found to contain, in many regions of the surface of the nanoparticulate titania agglomerates, gold nanoparticles having an average particle size of less than 3 nm (more than 50 particles counted and sized in a particular region) and to have a gold nanoparticle number density of greater than 5 nanoparticles per 100 nm and, in some areas, even greater than 7 nanoparticles per 100 nm$^2$.

Examples 7 and 8 and Comparative Example 2

Catalyst systems were prepared essentially as described above for Examples 3 and 6 and Comparative Example 1, with the exception that the sputter power was increased to 0.24 kW to produce samples having higher gold loadings. Colorimetry determinations and carbon monoxide testing were carried out for each sample, essentially as described above. The results are shown in Tables 3 and 4 below. A color trend similar to that described above was observed. Enhanced catalytic performance again generally was observed for the samples sputtered in an oxidizing atmosphere (Examples 7 and 8) relative to that sputtered in argon alone (Comparative Example 2), even though less gold appeared to have been deposited in the oxidizing atmospheres.

TABLE 3

| Example No. | Sputter Atmosphere: Ar (sccm)/O$_2$ (sccm) | L* | a* | b* |
|---|---|---|---|---|
| C-2 | 100/0 | 34.11 | 1.28 | −4.40 |
| 7 | 100/5.0 | 37.53 | −1.38 | −2.95 |
| 8 | 100/10.0 | 40.46 | −1.46 | −2.65 |

TABLE 4

| Example No. | Oxygen Flow Rate During Sputtering (sccm) | Weight Loss of Gold Sputter Target (g) | Percent CO Conversion at Various Times | | | | |
|---|---|---|---|---|---|---|---|
| | | | 0.5 minutes | 5 minutes | 10 minutes | 20 minutes | 30 minutes |
| C-2 | 0 | 6.70 | 96.6 | 96.6 | 96.5 | 96.3 | 95.9 |
| 7 | 5 | 6.15 | 98.4 | 98.2 | 98.0 | 97.7 | 97.4 |
| 8 | 10 | 5.62 | 98.4 | 98.3 | 98.0 | 97.7 | 97.3 |

Examples 9-11

Catalyst systems were prepared essentially as described above for Examples 1-6, with the exception that the nature of the oxidizing atmosphere was varied by replacing oxygen with water vapor, hydrogen peroxide, and ozone, respectively. For the sample of Example 9, water vapor was introduced to the vacuum chamber along with argon sputter gas. An enclosed flask (formed from a sealed glass tube having a 33 mm nominal diameter and 152 mm length) containing liquid water maintained at 25° C. was used as the source of the water vapor. The flask was first evacuated to remove any dissolved gases. Water vapor from the flask was then introduced to the vacuum chamber to generate a water vapor-containing atmosphere (about 50 weight percent water vapor, based upon the total weight of all gases in the vacuum chamber) by using a manual control valve to control the pressure inside the chamber. Argon flow was maintained at 100 sccm, and the gate valve opening to the vacuum pump was adjusted to maintain a total gas pressure of 10 mTorr during the sputtering process. For the sample of Example 10, hydrogen peroxide (H$_2$O$_2$) liquid was used instead of water to generate a hydrogen peroxide-containing atmosphere (about 50 weight percent hydrogen peroxide, based upon the total weight of all gases in the vacuum chamber) in essentially the same manner.

For the sample of Example 11, a two-compartment, stainless steel tank (having a diameter of 25.4 cm (10 inches) and a height of 30 cm (12 inches)) was designed such that a constant 10 sccm oxygen flow could be maintained in the bottom compartment. An ozone generator (XT-120, Air-Zone Inc., Suffolk, Va.) was placed in the top compartment, and a hole 5.08 centimeters (2 inches) in diameter was drilled in the plate separating the two compartments. This hole provided an opening for oxygen from the bottom compartment to enter the top compartment, so that an ozone-rich zone could be created in the top compartment. Both compartments were initially evacuated, and oxygen was then introduced to the bottom compartment. After 15 minutes, the ozone generator was turned on, and the resulting ozone was fed from the upper compartment to the vacuum chamber to generate an ozone-containing atmosphere (about 40 weight percent ozone, based upon the total weight of all gases in the vacuum chamber) through a manual control valve.

After gold sputtering essentially as described above for Examples 1-6, colorimetry determinations and carbon monoxide testing were carried out for each resulting sample, essentially as described above. The results are shown in Tables 5 and 6 below.

TABLE 5

| Example No. | Sputter Atmosphere | L* | a* | b* |
|---|---|---|---|---|
| C-1 | Ar (100 sccm) | 42.89 | 1.64 | −2.10 |
| 9 | Ar (100 sccm)/$H_2O$ | 43.78 | 1.94 | −1.82 |
| 10 | Ar (100 sccm)/$H_2O_2$ | 44.04 | 1.92 | −1.48 |
| 11 | Ar (100 sccm)/Ozone | 45.47 | 0.57 | −1.63 |

TABLE 6

| Example No. | Sputter Atmosphere | Weight Loss of Gold Sputter Target (g) | Percent CO Conversion at Various Times | | | | |
|---|---|---|---|---|---|---|---|
| | | | 0.5 minutes | 5 minutes | 10 minutes | 20 minutes | 30 minutes |
| C-1 | Ar | 3.71 | 90.7 | 90.4 | 90.1 | 89.6 | 88.8 |
| 9 | Ar/$H_2O$ | 3.21 | 95.5 | 95.1 | 94.4 | 93.8 | 92.9 |
| 10 | Ar/$H_2O_2$ | 2.78 | 91.2 | 91.6 | 92.2 | 91.8 | 90.8 |
| 11 | Ar/Ozone | 3.28 | 88.5 | 91.6 | 92.0 | 92.2 | 92.0 |

Comparative Example 3

300 cubic centimeters (cc; 135 g) Hombikat UV-100 titania (average primary crystallite size less than 10 nm by Scherer method; average surface area greater than 250 $m^2/g$) was dried at 150° C. for 24 hours. The resulting dried powder was loaded into the PVD apparatus described above in the detailed description having a particle agitator with a blade gap of 1.7 mm. The vacuum chamber of the apparatus was then evacuated overnight to a background pressure of $1 \times 10^{-4}$ Torr. Argon sputter gas was admitted to the chamber at a flow rate of 100 sccm, and the gate valve opening to the vacuum (diffusion) pump was adjusted to 10 mTorr process pressure. Gold sputtering was initiated at a power level of 0.10 kW and carried out essentially as described above, using a blade rotation rate of 6 rpm. The duration of the sputtering was 5 hours. Colorimetry determinations were carried out, essentially as described above. The results are shown in Table 7 below.

Example 12

300 cc (126 g) of Hombikat UV-100 titania powder was dried at 15° C. for 24 hours. The resulting dried powder was sputtered with gold essentially as described above for Comparative Example 3, except that the sputter gas contained oxygen as well as argon. The flow rate of argon was kept at 100 sccm, and the flow rate of oxygen was kept at 5 sccm. The total gas pressure was 10 mTorr, and a sputter power of 0.12 kW was utilized. Colorimetry determinations were carried out, essentially as described above. The results are shown in Table 7 below.

TEM examination of the gold-coated samples of Example 12 and Comparative Example 3 showed that both samples contained fine-nanoscale gold as well as ultra-nanoscale gold. The average gold nanoparticle size for Example 12 was 1.9 nm, and the average gold nanoparticle size for Comparative Example 3 was found to be 1.7 nm. Both samples were found to contain primarily nanoscale gold, with many regions having gold nanoparticle number densities greater than 5 nanoparticles per 100 nm.

Example 13

300 cc (121 g) of Hombikat UV-100 titania powder was dried at 15° C. for 24 hours. The resulting dried powder was sputtered with gold essentially as described above for Comparative Example 3, except that the sputter gas contained water vapor as well as argon. The flow rate of argon was kept at 100 sccm, and the water vapor was generated and admitted to the vacuum chamber essentially as described above for Example 9. The total gas pressure was 15 mTorr, and a sputter power of 0.12 kW was utilized. Colorimetry determinations were carried out, essentially as described above. The results are shown in Table 7 below.

Comparative Example 4

A catalyst sample consisting of gold nanoparticles supported on titania nanoparticles was obtained from the World Gold Council, London, UK (sample 85A, #02-06; manufactured by Sud Chemie, Japan). The sample was described by the manufacturer as being about 1.5 weight percent nanoparticulate gold (average particle size of 3.6 nm with a standard deviation of 0.28 nm) on Degussa P25 titania (a mixture of anatase and rutile crystalline forms in a ratio of 3:1; purity of 99 percent; average specific surface area of 50 $m^2/g$; average crystallite size of 25-35 nm; average agglomerate size of about 500 nm). The catalyst was said to have been prepared by a chemical deposition-precipitation method in which the titania was dispersed in an appropriate amount of aqueous solution of $HAuCl_4$ (Au content of 3 weight percent) at a fixed pH of 7. The resulting dispersion was said to have been aged at 70° C. for one hour and washed with distilled water several times. The resulting solid material was said to have been isolated and dried in air at 120° C. for 5 hours and then calcined in air at 400° C. for 4 hours.

Colorimetry determinations were carried out on the catalyst sample, essentially as described above. The results are shown in Table 7 below.

TABLE 7

| Example No. | Sputter Atmosphere | Weight Loss of Gold Sputter Target (g) | L* | a* | b* |
|---|---|---|---|---|---|
| C-3 | Ar | 14.19 | 63.46 | 1.11 | 0.10 |
| 12 | Ar/O$_2$ | 15.33 | 65.13 | −0.63 | −0.39 |
| 13 | Ar/H$_2$O | 13.97 | 67.00 | 2.08 | 0.15 |
| C-4 | N/A* | N/A* | 30.60 | 2.41 | −9.33 |

*N/A = not applicable.

Scanning Electron Microscopy (SEM)

The surfaces of the titania-coated carbon granules of Examples 1, 2, 3, 4, 6, 7, 9, 10, and 11 were examined using scanning electron microscopy. The surfaces of the granules appeared to be very similar for all the examples. The surfaces were found to comprise an open network of irregularly-shaped titania nanoparticle agglomerates. The smallest agglomerates were less than 0.1 micrometer in diameter, and the larger agglomerates were 5 to 6 micrometers in size (longest dimension). The agglomerates appeared granular in nature, with most granular features being 0.25 to 1 micrometer in size. The larger pores in the open network were 2 to 5 micrometers in size, and many pores in the 0.2 to 0.5 micrometer size range were distributed throughout the open network structure. At high magnification, very small pores (less than 0.1 micrometer in size) were observed throughout the agglomerates. At lower magnification (for example, 1000×), the titania nanoparticle coatings were observed to be non-uniform in thickness, with larger variations of thickness occurring every 3 to 12 micrometers to create a surface topography with random variations in thickness of 1 to 4 micrometers.

The titania powders of Examples 12 and 13 and Comparative Example 3 were also examined by SEM. Test samples were prepared by sprinkling the powder onto an aluminum SEM stub that had been pre-treated with acrylic adhesive. SEM examination revealed that all the samples appeared to be essentially identical in morphology. The powders consisted primarily of 0.2 to 1.0 micron titania nanoparticle agglomerates, along with larger clusters of these agglomerates. The smaller agglomerates were composed of smaller particles that appeared to be about 0.05 to about 0.2 micrometers in size. The larger clusters of agglomerates ranged from about 2 to 25 microns in size. A lattice-work of pores was observed in all the agglomerates, large and small. In the case of the larger clusters of agglomerates, 0.1 to 1 micrometer pores were observed, which were created by the packing of the smaller agglomerates that made up the clusters. In the smaller agglomerates, pores were observed that were less than 0.1 micrometer in size.

Examples 14 and 15 and Comparative Examples 5 and 6

Four catalyst systems comprising composite nanoparticulate support media (each catalyst system having 11 weight percent gold-bearing titania, based on the total weight of the catalyst system) were prepared by mixing 2.14 g of the catalyst systems (gold-bearing titania) described in Comparative Examples 3 and 4 and Examples 12 and 13 above, respectively, with 17.86 g of 12×20 US mesh (1.68 mm×0.841 mm) activated carbon granules (Kuraray GG; obtained from Kuraray Chemical Company, Ltd., Osaka, Japan; potassium carbonate-containing). The mixing was carried out in a 100 mL glass vial with vigorous shaking (by hand after securing the vial with a lid) for about 10 minutes or until visual inspection indicated that essentially all of the gold-bearing titania particles were coated on the activated carbon granules. Colorimetry determinations and carbon monoxide testing (under a 3600 ppm CO challenge with a flow rate of 64 liters per minute and 92 percent relative humidity) were carried out for the resulting composite catalyst systems, essentially as described above. The results are shown in Tables 8 and 9 below.

TABLE 8

| Example No. | Sputter Atmosphere (Example No. of Gold-bearing Titania) | L* | A* | b* |
|---|---|---|---|---|
| C-5 | Ar (C-3) | 58.98 | 0.51 | −3.93 |
| 14 | Ar/O$_2$ (Example 12) | 60.79 | −1.17 | −3.79 |
| 15 | Ar/H$_2$O (Example 13) | 58.34 | 0.30 | −3.67 |
| C-6 | N/A* (C-4) | 32.69 | 0.45 | −5.02 |

*N/A = not applicable.

Comparative Examples 7-9

The gold-coated titania powders of Comparative Example 3 and Examples 12 and 13 were treated with ozone to determine the effect of an ozone post-treatment on catalyst activity (Comparative Examples 7-9, respectively). Ozone was generated by an XT-800 ozone generator (Air-Zone Incorporated, Suffolk, Va.) (890 mg/hr at 1.05 cubic meters per minute (37 CFM)). The flow of air/ozone was directed into a 4 liter beaker holding open vials containing 3.0 g of each of the powders of Comparative Example 3 and Examples 12 and 13. The powders were exposed to the flow of ozone for 30 minutes and then mounted onto Kuraray GG carbon (essentially as described above for Examples 14 and 15) and tested for catalyst activity as described above. The results of CO testing, under a 3600 ppm CO challenge with a flow rate of 64 liters per minute and 92 percent relative humidity, are shown in Table 9 below.

TABLE 9

| Example No. | Sputter Atmosphere (Example No. of Gold-bearing Titania) | Ozone Post-treatment of Gold-bearing Titania | Percent CO Conversion at Various Times | | |
|---|---|---|---|---|---|
| | | | 0.5 minutes | 8 minutes | 15.5 minutes |
| C-5 | Ar (C-3) | No | 52.4 | 35.1 | 39.3 |
| 14 | Ar/O$_2$ (Example 12) | No | 44.5 | 42.0 | 50.5 |
| 15 | Ar/H$_2$O (Example 13) | No | 61.8 | 45.6 | 47.3 |
| C-7 | Ar (C-3) | Yes | 32.6 | 28.7 | 33.5 |
| C-8 | Ar/O$_2$ (Example 12) | Yes | 25.4 | 27.8 | 32.7 |
| C-9 | Ar/H$_2$O (Example 13) | Yes | 34.2 | 28.1 | 31.3 |

The referenced descriptions contained in the patents, patent documents, and publications cited herein are incorporated by reference in their entirety as if each were individually incorporated. Various unforeseeable modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only, with the scope of the invention intended to be limited only by the claims set forth herein as follows:

We claim:

1. A process of depositing fine-nanoscale gold onto a nanoparticulate support medium by physical vapor deposition in an oxidizing atmosphere, the process comprising the steps of, in order:

providing a nanoparticulate support medium that is not a physically vapor deposited support medium;

placing the nanoparticulate support medium in a physical vapor deposition apparatus;

exposing the nanoparticulate support medium to an oxidizing atmosphere in the physical vapor deposition apparatus;

and, physically vapor depositing fine-nanoscale catalytically active gold onto the nanoparticulate support medium while the nanoparticulate support medium is the oxidizing atmosphere in the physical vapor deposition apparatus.

2. The process of claim 1, wherein said depositing is carried out by a technique selected from sputter deposition, evaporation, cathodic arc deposition, and combinations thereof.

3. The process of claim 1, wherein said oxidizing atmosphere comprises at least one oxygen-containing gas.

4. The process of claim 3, wherein said oxygen-containing gas is selected from oxygen, water, hydrogen peroxide, ozone, and combinations thereof.

5. The process of claim 3, wherein said oxygen-containing gas is present in an amount from 0.05 percent to 60 percent by weight, based upon the total weight of all gases in said oxidizing atmosphere.

6. The process of claim 1, wherein said fine-nanoscale gold comprises gold bodies having all dimensions less than or equal to 4 nanometers in size.

7. The process of claim 1, wherein said fine-nanoscale gold is deposited onto said nanoparticulate support medium under conditions such that the resulting catalyst system comprises 0.005 to 10 weight percent gold, based upon the total weight of said fine-nanoscale gold and said nanoparticulate support medium.

8. The process of claim 7, wherein said catalyst system comprises 0.005 to 5 weight percent gold, based upon the total weight of said fine-nanoscale gold and said nanoparticulate support medium.

9. The process of claim 1, wherein said nanoparticulate support medium comprises nanoparticles having at least two dimensions less than or equal to 30 nanometers in size.

10. The process of claim 1, wherein said nanoparticulate support medium further comprises nanoparticles having an average diameter greater than 50 nanometers and less than 100 nanometers.

11. The process of claim 1, wherein said nanoparticulate support medium comprises agglomerates of nanoparticles.

12. The process of claim 11, wherein said agglomerates have all dimensions in the range of 0.1 micrometer to 15 micrometers in average size.

13. The process of claim 1, wherein said nanoparticulate support medium has a porosity greater than 0.4.

14. The process of claim 1, wherein said nanoparticulate support medium is nanoporous.

15. The process of claim 1, wherein said nanoparticulate support medium has a total nanoporous capacity for pores in the size range of 1 nanometer to 10 nanometers that is greater than 20 percent of its total volume of pores in the size range of 1 nanometer to 100 nanometers.

16. The process of claim 1, wherein said nanoparticulate support medium comprises support material having a form selected from powders, particles, pellets, granules, extrudates, fibers, shells, honeycombs, plates, scrims, fabrics, paper, and combinations thereof.

17. The process of claim 16, wherein said form of said support material is selected from powders, particles, and combinations thereof.

18. The process of claim 1, wherein said nanoparticulate support medium comprises a material selected from carbonaceous materials, silicaceous materials, metal oxides, and combinations thereof.

19. The process of claim 1, wherein said nanoparticulate support medium is a composite support medium comprising particles of guest material borne on particles of host material that are larger in average diameter than said particles of guest material.

20. The process of claim 19, wherein said particles of guest material have an average diameter of 1 nanometer to 30 nanometers, and said particles of host material have an average diameter of 3 micrometers to 5000 micrometers.

21. The process of claim 19, wherein said particles of guest material are porous.

22. The process of claim 19, wherein said guest material comprises a metal oxide, and said host material comprises carbonaceous material, metal oxide, or a combination thereof.

23. The process of claim 22, wherein said guest material comprises an oxide comprising titanium, cerium, or a combination thereof; and said host material comprises carbonaceous material.

24. The process of claim 1, wherein said process further comprises applying an activating agent to said nanoparticulate support medium.

25. The process of claim 1, wherein said process further comprises heat treating said nanoparticulate support medium.

26. The process of claim 1, wherein said nanoparticulate support medium is mixed and ground during at least a portion of said physical vapor deposition.

27. The process of claim 1, wherein said process further comprises providing at least one metal in addition to said fine-nanoscale gold on said nanoparticulate support medium.

28. A process comprising depositing fine-nanoscale catalytically active gold onto a composite catalyst-support media comprising nanoparticulate metal oxide guest material and activated carbon host material; wherein said nanoparticulate metal oxide sues material is not a physically vapor deposited material and wherein said depositing is carried out by sputter deposition in an oxidizing atmosphere comprising at least one oxygen-containing gas selected from oxygen, water, hydrogen peroxide, ozone, and combinations thereof.

29. The process of claim 28, wherein said metal oxide is selected from oxides of titanium and combinations thereof.

30. The process of claim 28, wherein said oxygen-containing gas is selected from oxygen, water, and combinations thereof.

31. The process of claim 1, wherein said fine-nanoscale gold is deposited onto said nanoparticulate support medium under conditions such that said gold is immobilized on the surface of the nanoparticulate support medium in the form of catalytically active elemental gold particles of up to about 5 nm in average size.

32. The process of claim 31, with the proviso that no other metals are co-deposited by physical vapor deposition during the deposition of the gold.

33. A process of depositing fine-nanoscale gold onto a nanoparticulate support medium by physical vapor deposition in an oxidizing atmosphere, the process consisting of the steps of, in order:
   providing a nanoparticulate support medium that is not a physically vapor deposited support medium;
   placing the nanoparticulate support medium in a physical vapor deposition apparatus;
   exposing the nanoparticulate support medium to an oxidizing atmosphere in the physical vapor deposition apparatus;
   and,
   physically vapor depositing fine-nanoscale catalytically active gold onto the nanoparticulate support medium while the nanoparticulate support medium is the oxidizing atmosphere in the physical vapor deposition apparatus.

34. The process of claim 28, wherein said composite catalyst-support media is mixed and ground during at least a portion of said sputter deposition.

* * * * *

UNITED STATES PATENT AND TRADEMARK OFFICE
CERTIFICATE OF CORRECTION

PATENT NO. : 8,900,420 B2  
APPLICATION NO. : 11/841362  
DATED : December 2, 2014  
INVENTOR(S) : Badri Veeraraghavan Page 1 of 1

It is certified that error appears in the above-identified patent and that said Letters Patent is hereby corrected as shown below:

On the Title Page, References Cited

Page 2, Column 2 (Other Publications)
Line 41, Delete "XPX" and insert -- XPS --, therefor.

In the Specification

Column 12
Line 54 (Approx.), Delete "thereof," and insert -- thereof; --, therefor.

Column 12
Line 56 (Approx.), Delete "thereof," and insert -- thereof; --, therefor.

Column 25
Line 59, Delete "15° C." and insert -- 150° C. --, therefor.

Column 26
Line 9 (Approx.), Delete "100 nm." and insert -- 100 nm$^2$. --, therefor.

Column 26
Line 15 (Approx.), Delete "15° C." and insert -- 150° C. --, therefor.

In the Claims

Column 30
Line 52, In Claim 28, delete "sues" and insert -- guest --, therefor.

Signed and Sealed this  
Eleventh Day of August, 2015

Michelle K. Lee  
*Director of the United States Patent and Trademark Office*